(12) United States Patent
Maruyama et al.

(10) Patent No.: US 11,411,499 B2
(45) Date of Patent: Aug. 9, 2022

(54) INTEGRATED CIRCUIT AND POWER SUPPLY CIRCUIT

(71) Applicant: FUJI ELECTRIC CO., LTD., Kawasaki (JP)

(72) Inventors: Hiroshi Maruyama, Matsumoto (JP); Takato Sugawara, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/328,598

(22) Filed: May 24, 2021

(65) Prior Publication Data
US 2022/0038009 A1    Feb. 3, 2022

(30) Foreign Application Priority Data

Jul. 30, 2020  (JP) .............................. JP2020-129149

(51) Int. Cl.
*H02M 3/335*    (2006.01)
*H02M 1/08*    (2006.01)

(52) U.S. Cl.
CPC ............. *H02M 3/335* (2013.01); *H02M 1/08* (2013.01)

(58) Field of Classification Search
None
See application file for complete search history.

(56) References Cited

U.S. PATENT DOCUMENTS 6,111,762 A * 8/2000 Igarashi ............ H02M 3/33523
                                                363/21.16
7,554,367 B2    6/2009 Chen et al.

* cited by examiner

*Primary Examiner* — Jeffery S Zweizig
(74) *Attorney, Agent, or Firm* — Rabin & Berdo, P.C.

(57) ABSTRACT

A power supply circuit includes an inductor, a power transistor configured to control an inductor current flowing through the inductor, and an integrated circuit driving the power transistor. The integrated circuit includes a first terminal that receives a power supply voltage for operating the integrated circuit, generated according to a variation in the inductor current, a second terminal to which a control electrode of the power transistor is coupled, a first drive circuit configured to drive the power transistor via the second terminal during a first time period to turn on the power transistor, and a second drive circuit configured to drive the power transistor via the second terminal during a second time period to turn on the power transistor, the second time period including at least a part of the first time period, driving capability of the second drive circuit being lower than that of the first drive circuit.

14 Claims, 13 Drawing Sheets

| SIGNAL | In="H" AND en="H" (Sup, Sdown TARGET) | | | | In="H" AND en="L" | | IN="L" |
|---|---|---|---|---|---|---|---|
| | STATE 1 [GATE Vgl LARGE] | STATE 2 [GATE Vgl INTERMEDIATE] | STATE 3 [GATE Vgl SMALL] | NO-DRIVE STATE | STATE 4 [GATE Vgl LARGE] | STATE 5 [GATE Vgl SMALL] | |
| D0 | H | L | L | L | H | L | L |
| D1 | H | H | L | L | H | L | L |
| D2 | H | H | H | L | H | H | L |
| D3 | L | L | L | L | L | L | H |

FIG.7

INTEGRATED CIRCUIT AND POWER SUPPLY CIRCUIT

The present application claims priority pursuant to 35 U.S.C. § 119 from Japanese patent application number 2020-129149 filed on Jul. 30, 2020, the entire disclosure of which is hereby incorporated by reference herein.

BACKGROUND

Technical Field

The present disclosure relates to an integrated circuit and a power supply circuit.

Description of the Related Art

There are integrated circuits each driving a power transistor to control an inductor current flowing through a transformer of an AC-DC convertor (for example, U.S. Pat. No. 7,554,367).

Among the aforementioned integrated circuits, there are integrated circuits each operating using a power supply voltage generated from a voltage that is generated according to a variation in the inductor current. Moreover, when the power transistor is, for example, an NMOS (N-type Metal-Oxide-Semiconductor) transistor, the power supply voltage is used as a gate voltage when turning on the power transistor. However, the power supply voltage may rise above the rated value of the gate voltage of the power transistor. In this case, it is needed to use a power transistor whose rated value of the gate voltage is high, but this increases the cost.

Moreover, when the power supply voltage is high, a high-withstand voltage transistor which can withstand the rise in the power supply voltage is needed. However, the high-withstand voltage transistor is not prepared in a standard manufacturing process. Accordingly, the integrated circuit needs to be manufactured in a special manufacturing process and this increases the manufacturing cost of the integrated circuit.

The present disclosure is directed to provision of an integrated circuit capable of safely driving a power transistor even when a power supply voltage is high.

SUMMARY

An aspect of the present disclosure is an integrated circuit for a power supply circuit configured to generate an output voltage at a target level from an alternating current (AC) voltage input thereto, the power supply circuit including an inductor to which a rectified voltage corresponding to the AC voltage is applied, a power transistor configured to control an inductor current flowing through the inductor, the integrated circuit including: a first terminal that receives a power supply voltage for operating the integrated circuit, the power supply voltage being generated according to a variation in the inductor current; a second terminal to which a control electrode of the power transistor is coupled; a first drive circuit configured to drive the power transistor via the second terminal during a first time period to turn on the power transistor; and a second drive circuit configured to drive the power transistor via the second terminal during a second time period to turn on the power transistor, the second time period including at least a part of the first time period, the second drive circuit having driving capability lower than that of the first drive circuit.

Another aspect of the present disclosure is a power supply circuit configured to generate a direct-current (DC) voltage from an alternating current (AC) voltage inputted thereto, the power supply circuit comprising: an inductor to which a rectified voltage corresponding to the AC voltage is applied; a power transistor configured to control an inductor current flowing through the inductor; and an integrated circuit configured to drive the power transistor, the integrated circuit including a first terminal that receives a power supply voltage for operating the integrated circuit, the power supply voltage being generated according to a variation in the inductor current, a second terminal to which a control electrode of the power transistor is coupled, a first drive circuit configured to drive the power transistor via the second terminal during a first time period to turn on the power transistor, and a second drive circuit configured to drive the power transistor via the second terminal during a second time period to turn on the power transistor, the second time period including at least a part of the first time period, the second drive circuit having driving capability lower than that of the first drive circuit.

BRIEF DESCRIPTION OF THE DRAWINGS

FIG. 7 is a diagram illustrating logic levels of control signals D0 to D3 outputted by an adjustment circuit 81 in each state.

DETAILED DESCRIPTION

At least following matters will become apparent from the description of the present specification and the accompanying drawings.

Embodiments

<<<Outline of AC-DC Convertor 10>>>

Figure 1:
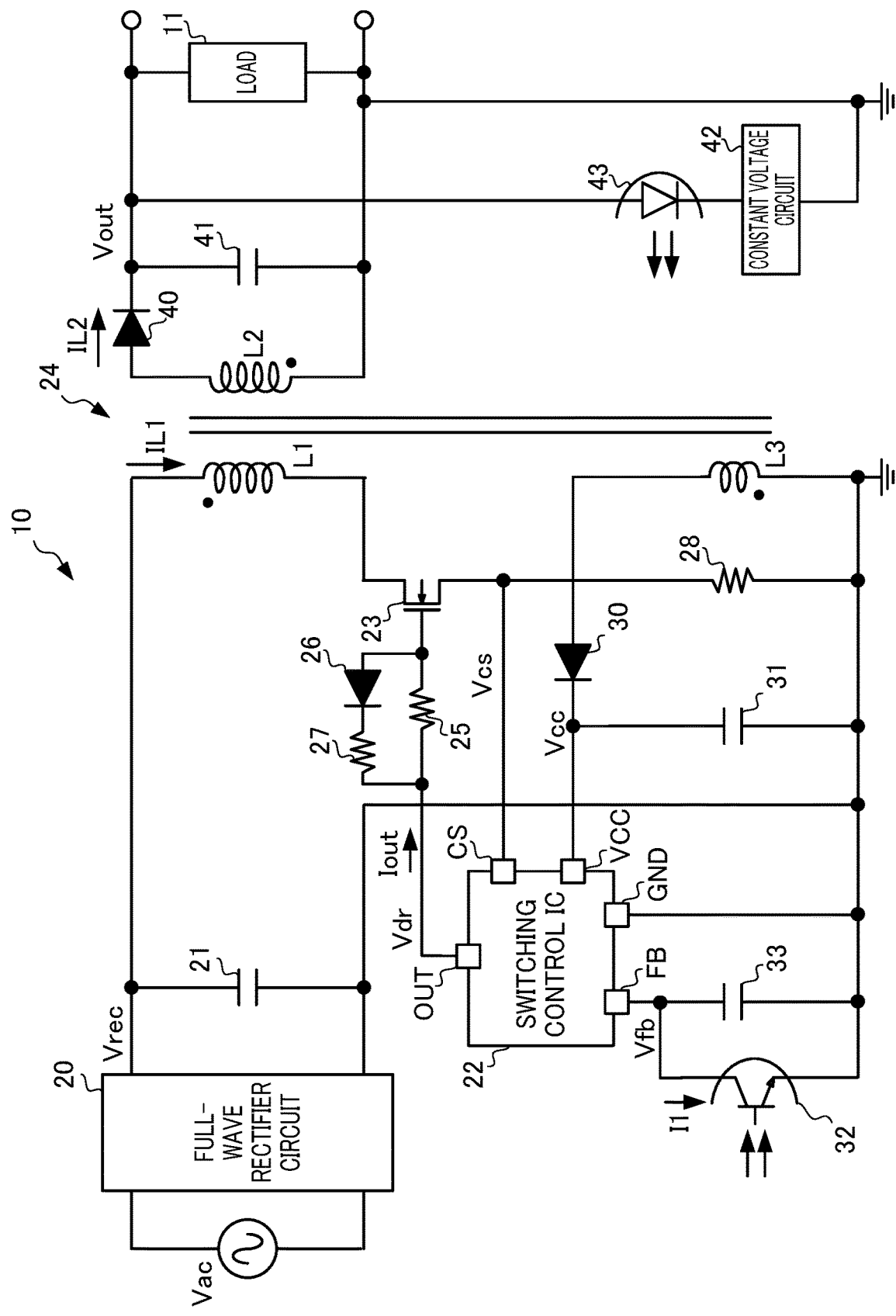
FIG. 1 is a diagram illustrating an example of an AC-DC convertor 10.

FIG. 1 a diagram illustrating an example of a configuration of an AC-DC convertor 10 according to one embodiment of the present disclosure. The AC-DC convertor 10 is a flyback power supply circuit that generates an output voltage Vout at a target level from an alternating current (AC) voltage Vac of a commercial power supply.

The AC-DC convertor 10 includes a full-wave rectifier circuit 20, capacitors 21, 31, 33, and 41, a switching control IC 22, a power transistor 23, a transformer 24, resistors 25, 27, and 28, diodes 26, 30, and 40, a phototransistor 32, a constant voltage circuit 42, and a light emitting diode 43.

The full-wave rectifier circuit 20 full-wave rectifies the inputted AC voltage Vac and outputs the resultant, and the capacitor 21 smooths the output from the full-wave rectifier circuit 20 to generate a voltage Vrec.

The switching control IC 22 is an integrated circuit that controls switching of the power transistor 23 such that the output voltage Vout achieves the target level.

The switching control IC 22 drives the power transistor 23 based on the output voltage Vout and a current flowing through a primary coil L1 of the transformer 24. Note that, in an embodiment of the present disclosure, the resistors 25 and 27 and the diode 26 are coupled between a terminal OUT of the switching control IC 22 and a gate electrode of the power transistor 23.

However, the terminal OUT may be directly coupled to the power transistor 23. Here, the resistors 25 and 27 and the diode 26 are elements that control a slope at the rise or fall of the gate voltage of the power transistor 23.

In an embodiment of the present disclosure, the term "couple" includes direct coupling and indirect coupling via a circuit element. Details of the switching control IC 22 will be described later.

The power transistor 23 is, for example, an NMOS transistor that controls power at a load 11 of the AC-DC convertor 10. Although the power transistor 23 is a metal oxide semiconductor (MOS) transistor in an embodiment of the present disclosure, the power transistor 23 is not limited thereto. The power transistor 23 may be another type of switching element such as a bipolar transistor or the like, as long as the power transistor 23 is a transistor capable of controlling power.

The resistor 28 is provided between the ground and a source electrode of the power transistor 23 to detect a current flowing through the power transistor 23 and the primary coil L1 of the transformer 24. Note that the resistor 28 generates a voltage Vcs indicating a current value of the current flowing through the primary coil L1.

The transformer 24 includes the primary coil L1, a secondary coil L2, and an auxiliary coil L3. The secondary coil L2 is insulated from each of the primary coil L1 and the auxiliary coil L3. In the transformer 24, a voltage is generated across each of the secondary coil L2 and the auxiliary coil L3 according to a variation in a voltage across the primary coil L1.

The primary coil L1 according to an embodiment of the present disclosure has one end to which the voltage Vrec is applied, and the other end to which a drain electrode of the power transistor 23 is coupled. Accordingly, when the driving of the power transistor 23 is started, a voltage is generated across each of the secondary coil L2 and the auxiliary coil L3.

The diode 30 rectifies a current from the auxiliary coil L3 of the transformer 24, and supplies the resultant to the capacitor 31. Accordingly, when the driving of the power transistor 23 is started, the capacitor 31 is charged with the current from the diode 30.

Although detailed description is omitted, the switching control IC 22 starts up based on the voltage Vrec and operates based on a voltage Vcc (hereinafter, referred to as the power supply voltage Vcc) charged in the capacitor 31 after start-up.

The diode 40 rectifies a current from the secondary coil L2 of the transformer 24 and supplies the resultant to the capacitor 41. Since the capacitor 41 is charged with the current from the diode 40, the output voltage Vout is generated across the capacitor 41. Note that, in an embodiment of the present disclosure, the numbers of turns and polarities of the primary coil L1 and the secondary coil L2 are defined such that the longer the time period during which the power transistor 23 is on, the higher the output voltage Vout.

The constant voltage circuit 42 generates a constant direct-current (DC) voltage, and is configured using a shunt regulator, for example.

The light emitting diode 43 emits light having an intensity corresponding to a difference between the output voltage Vout and an output of the constant voltage circuit 42, and configures a photocoupler with the phototransistor 32, which will be described later. In an embodiment of the present disclosure, when the level of the output voltage Vout rises, the intensity of the light from the light emitting diode 43 increases.

The phototransistor 32 receives light from the light emitting diode 43, and passes a sink current I1 having a magnitude increasing as the intensity of the light increases.

The capacitor 33 is an element that stabilizes a voltage Vfb generated at a terminal FB of the switching control IC 22 when the sink current I1 flows.

Note that the primary coil L1 corresponds to an "inductor" and the voltage Vrec corresponds to a "rectified voltage".

<<<Configuration of Switching Control IC 22>>>

Figure 2:
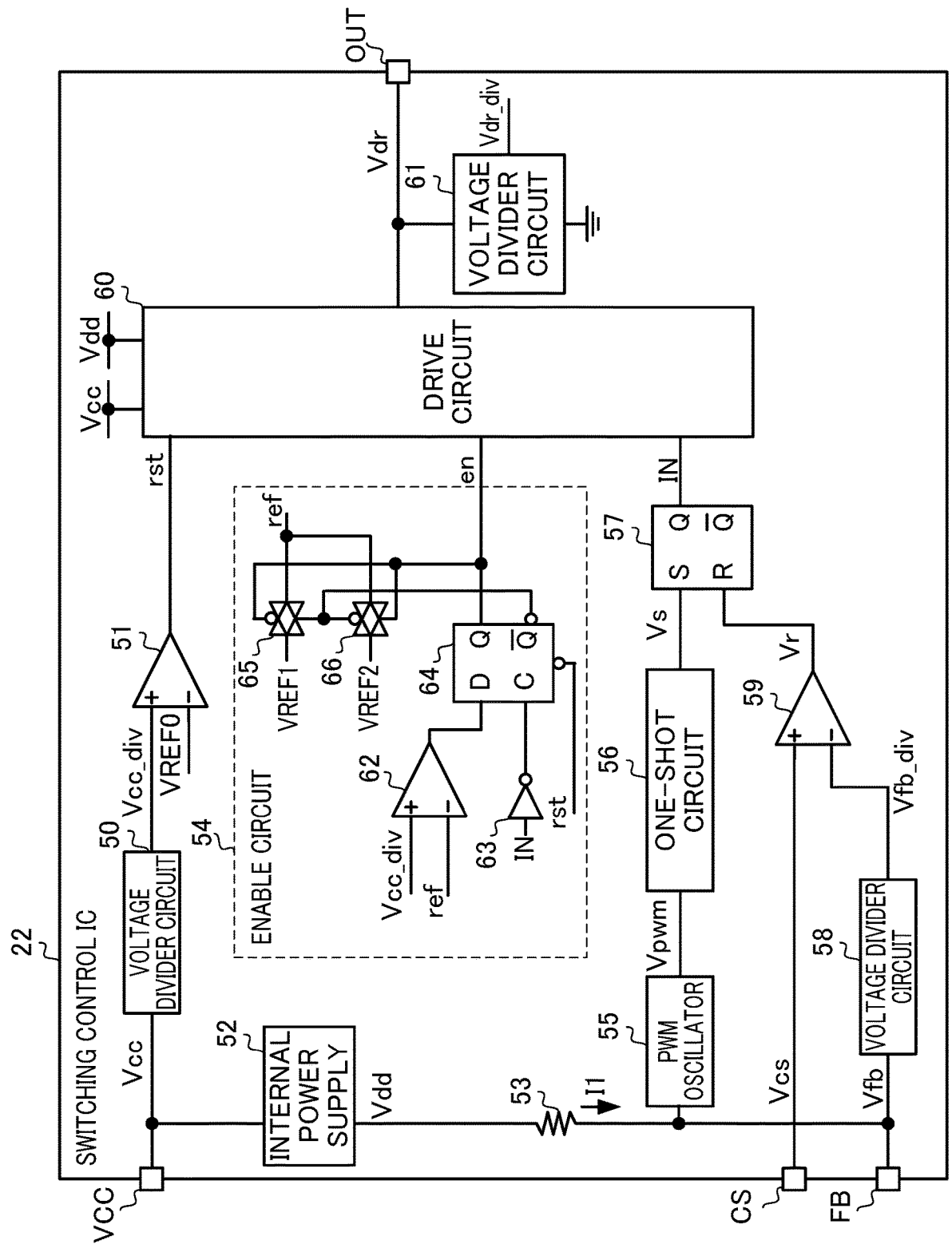
FIG. 2 is a diagram illustrating an example of a switching control IC 22.

FIG. 2 is a diagram illustrating an example of the switching control IC 22. The switching control IC 22 is an integrated circuit that controls the driving of the power transistor 23, and has VCC, FB, CS, and OUT. Note that a terminal GND is omitted for the sake of convenience.

The terminal VCC is a terminal to which the power supply voltage Vcc is applied, the power supply voltage Vcc being generated from the current from the coil L3 according to a variation in an inductor current flowing through the coil L1.

The terminal FB is a terminal at which the voltage Vfb corresponding to the sink current I1 of the phototransistor 32 is generated.

The terminal CS is a terminal to which the voltage Vcs is applied, the voltage Vcs being generated with the inductor current I1 flowing through the resistor 28 in response to turning-on of the power transistor 23.

The terminal OUT is a terminal from which a voltage Vdr for driving the power transistor 23 is outputted. The terminal OUT is coupled to a gate electrode of the power transistor 23 via the resistors 25 and 27 and the diode 26.

The switching control IC 22 also includes voltage divider circuits 50, 58, and 61, comparators 51 and 59, an internal power supply 52, a resistor 53, an enable circuit 54, a PWM oscillator 55, a one-shot circuit 56, an SR flip-flop 57, and a drive circuit 60.

The voltage divider circuit 50 divides the power supply voltage Vcc to obtain, for example, one tenth of the power supply voltage Vcc, thereby generating a voltage Vcc_div.

The comparator 51 is a circuit that compares the voltage Vcc_div with a reference voltage VREF0, to output a reset signal rst. The reference voltage VREF0 described herein is a voltage for determining whether the power supply voltage Vcc has risen to an operational voltage of the switching control IC 22. In other words, the switching control IC 22 starts operating in response to the reset signal rst becoming a high level (hereinafter, referred to as high or high level).

Specifically, when the comparator 51 outputs the high signal rst, the circuits in the switching control IC operate. Meanwhile, when the comparator 51 outputs the signal rst at a low level (hereinafter, referred to as low or low level), the circuits in the switching control IC 22 are reset.

The internal power supply 52 is a circuit that generates an internal voltage Vdd from the power supply voltage Vcc. Note that the internal voltage Vdd is supplied to circuits such as a control circuit 70, a second drive circuit 72, and the like, which will be described later. Moreover, the voltage Vfb generated at the terminal FB is a voltage generated with the sink current I1 of the phototransistor 32 flowing through the resistor 53 coupled between the internal voltage Vdd and the terminal FB.

Note that, when the output voltage Vout exceeds the target level, the light emitting diode 43 emits light having a higher intensity, and the sink current I1 of the phototransistor 32 increases. As a result, the current flowing through the resistor 53 increases and thus the voltage Vfb drops. In contrast, when the output voltage Vout falls below the target level, the current flowing through the resistor 53 decreases and the voltage Vfb rises.

The enable circuit 54 generates a signal en for controlling an operation of the drive circuit 60, which will be described later, based on the voltage Vcc_div at the fall of a signal IN. The enable circuit 54 includes a comparator 62, an inverter 63, a D flip-flop 64, and transfer gates 65 and 66.

The comparator 62 is a circuit that compares the voltage Vcc_div with a reference voltage ref. Note that the reference voltage ref is one of reference voltages VREF1 and VREF2 selected based on the signal en.

The inverter 63 is an element that inverts the signal IN, which will be described later, and outputs the resultant as a clock of the D flip-flop 64.

The D flip-flop 64 receives an output of the comparator 62 at the rise of the clock, and outputs the resultant as a Q output. Note that the Q output of the D flip-flop 64 results in the signal en.

The transfer gates 65 and 66 are circuits that output one of the reference voltages VREF1 and VREF2 as the reference voltage ref based on the signal en. Specifically, the transfer gates 65 and 66 output the reference voltage VREF1 as the reference voltage ref when the signal en is low, and output the reference voltage VREF2 as the reference voltage ref when the signal en is high.

As has been described, the enable circuit 54 outputs the low signal en, when the voltage Vcc_div falls below the reference voltage VREF2 at the fall of the signal IN after being higher than the reference voltage VREF1 with the signal en being high.

Meanwhile, the enable circuit 54 outputs the high signal en, when the voltage Vcc_div exceeds the reference voltage VREF1 at the fall of the signal IN after being lower than the reference voltage VREF2 with the signal en being low. In cases other than those described above, the enable circuit 54 maintains the signal en at the same logic level as before.

The PWM oscillator 55 is a circuit that outputs a signal Vpwm having a PWM waveform with a switching frequency according to the voltage Vfb.

The one-shot circuit 56 generates a one-shot pulse Vs at the rise of the signal Vpwm.

The SR flip-flop 57 has a set input to which the one-shot pulse Vs is inputted, and a reset input to which a reset signal Vr, which will be described later, is inputted, to generate the signal IN. Accordingly, the SR flip-flop 57 generates a high signal IN in response to the one-shot pulse Vs going high, and generates a low signal IN in response to the reset signal Vr going high.

The voltage divider circuit 58 divides the voltage Vfb generated at the terminal FB, to generate a voltage Vfb_div.

The comparator 59 compares the voltage Vfb_div and the voltage Vcs from the terminal CS, to generate the reset signal Vr. Specifically, the comparator 59 outputs a low reset signal Vr when the voltage Vcs is lower than the voltage Vfb_div, and outputs a high reset signal Vr when the voltage Vcs is higher than the voltage Vfb_div.

The drive circuit 60 operates to output the voltage Vdr for driving the power transistor 23 in response to the signal IN, upon the reset signal rst going high.

Specifically, when the signal en is high, the drive circuit 60 clamps the clamped voltage Vdr to a predetermined level and outputs the voltage Vdr, in response to the high signal IN. Meanwhile, when the signal en is low, the drive circuit 60 outputs the voltage Vdr at the voltage level of the power supply voltage Vcc in response to the high signal IN.

On the other hand, the drive circuit 60 outputs the voltage Vdr at the ground level when the signal IN is low. Details of the drive circuit 60 will be described later.

The voltage divider circuit 61 divides the voltage Vdr to obtain, for example, one tenth of the voltage Vdr, thereby generating a voltage Vdr_div. The voltage divider circuit 61 outputs the voltage Vdr_div to the control circuit 70 and the second drive circuit 72, which will be described later.

Moreover, the switching control IC 22 operates such that the AC-DC convertor 10 outputs the output voltage Vout at the target level. The following describes a case where the switching frequency of the power transistor 23 proportionally changes according to the voltage Vfb corresponding to the output voltage Vout.

First, when the output voltage Vout is higher than the target level, the voltage Vfb drops and the PWM oscillator 55 outputs the signal Vpwm having a lower switching frequency. As a result, the switching control IC 22 causes the power transistor 23 to be on for a shorter time period and the AC-DC convertor 10 drops the output voltage Vout to the target level.

Next, when the output voltage Vout is lower than the target level, the voltage Vfb rises and the PWM oscillator 55 outputs the signal Vpwm having a higher switching frequency. As a result, the switching control IC 22 causes the power transistor 23 to be on for a longer time period and the AC-DC convertor 10 raises the output voltage Vout to the target level.

Note that the terminal VCC corresponds to a "first terminal", the terminal OUT corresponds to a "second terminal", and the comparator 62 corresponds to a "second determination circuit".

The following describes an operation of the switching control IC 22 in the case where the AC-DC convertor 10 operates continuously or discontinuously.

<<<Operations of AC-DC Convertor 10 when Operating Continuously>>>

Figure 3:
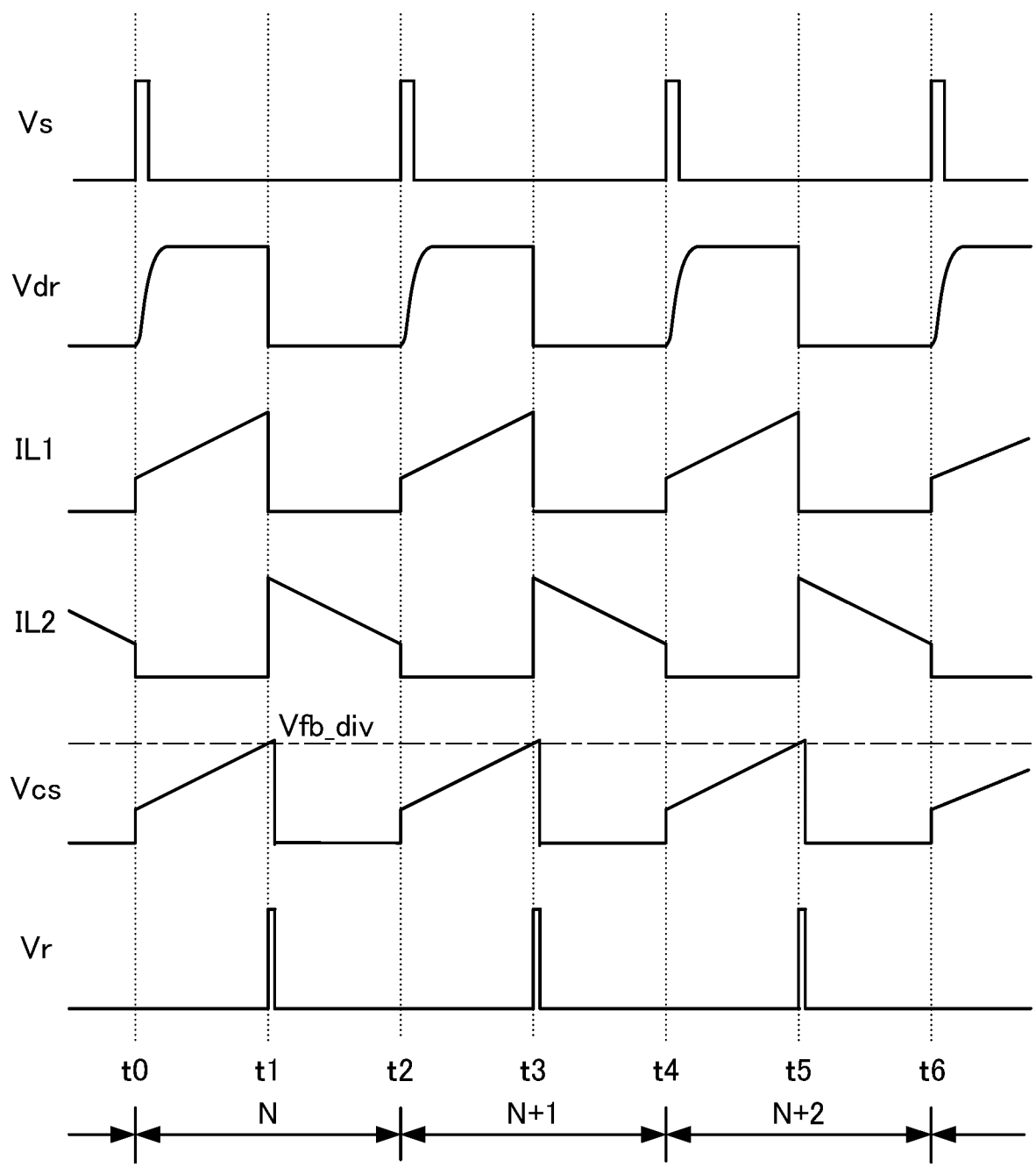
FIG. 3 is a diagram illustrating an example of an operation of an AC-DC convertor 10 when operating continuously.

FIG. 3 is a diagram illustrating an operation of the switching control IC 22 when the switching control IC 22 causes the AC-DC convertor 10 to operate continuously. Note that a time period from time t0 to time t2 is referred to as Nth period, a time period from time t2 to time t4 is referred to as (N+1)th period, and a time period from time t4 to time t6 is referred to as (N+2)th period. First, the Nth period will be described below.

At time t0, the PWM oscillator 55 outputs the signal Vpwm with the switching frequency corresponding to the voltage Vfb. The one-shot circuit 56 outputs a signal Vs, which is a high one-shot pulse, at the rise of the signal Vpwm.

Upon receiving the signal Vs, which is the high one-shot pulse, the SR flip-flop 57 outputs the high signal IN. This causes the drive circuit 60 to raise the voltage level of a signal Vdr and turn on the power transistor 23.

When the voltage level of the signal Vdr rises and the power transistor 23 is turned on, an inductor current IL1 flowing through the primary coil L1 increases with a positive offset because the AC-DC convertor 10 is operating continuously. This causes the voltage Vcs generated with the inductor current IL1 flowing through the resistor 28 to increase with a positive offset, similarly to the inductor current IL1.

Meanwhile, since the secondary coil L2 is electromagnetically coupled thereto with the opposite polarity and the diode 40 is caused to be off, an inductor current IL2 flowing through the secondary coil L2 does not flow when the power transistor 23 is on, and energy is stored in the transformer 24.

When the voltage Vcs exceeds the voltage Vfb_div at time t1, the comparator 59 outputs the high signal Vr. The SR flip-flop 57 thereby outputs the low signal IN, and the drive circuit 60 lowers the voltage level of the signal Vdr and turns off the power transistor 23.

When the voltage level of the signal Vdr drops and the power transistor 23 is turned off, the inductor current IL1 rapidly decreases. The energy stored in the transformer 24 is thereby outputted from the secondary coil L2 via the diode 40. In this case, the inductor current IL2 flows while decreasing at a fixed rate. Moreover, the inductor current IL2 does not reach 0 at the moment of time t2 yet, but reaches 0 when the power transistor 23 is turned on and the inductor current IL1 starts flowing.

The operation from time t0 to time t2 is repeated in a time period from time t2 to time t6. Accordingly, in the continuous operation, the AC-DC convertor 10 operates without the inductor current IL1 becoming 0 upon turning on the power transistor 23. In the continuous operation, one of the inductor current IL1 and the inductor current IL2 is flowing at any point in the time period from time t0 to time t6.

<<<Operation of AC-DC Convertor 10 when Operating Discontinuously>>>

Figure 4:
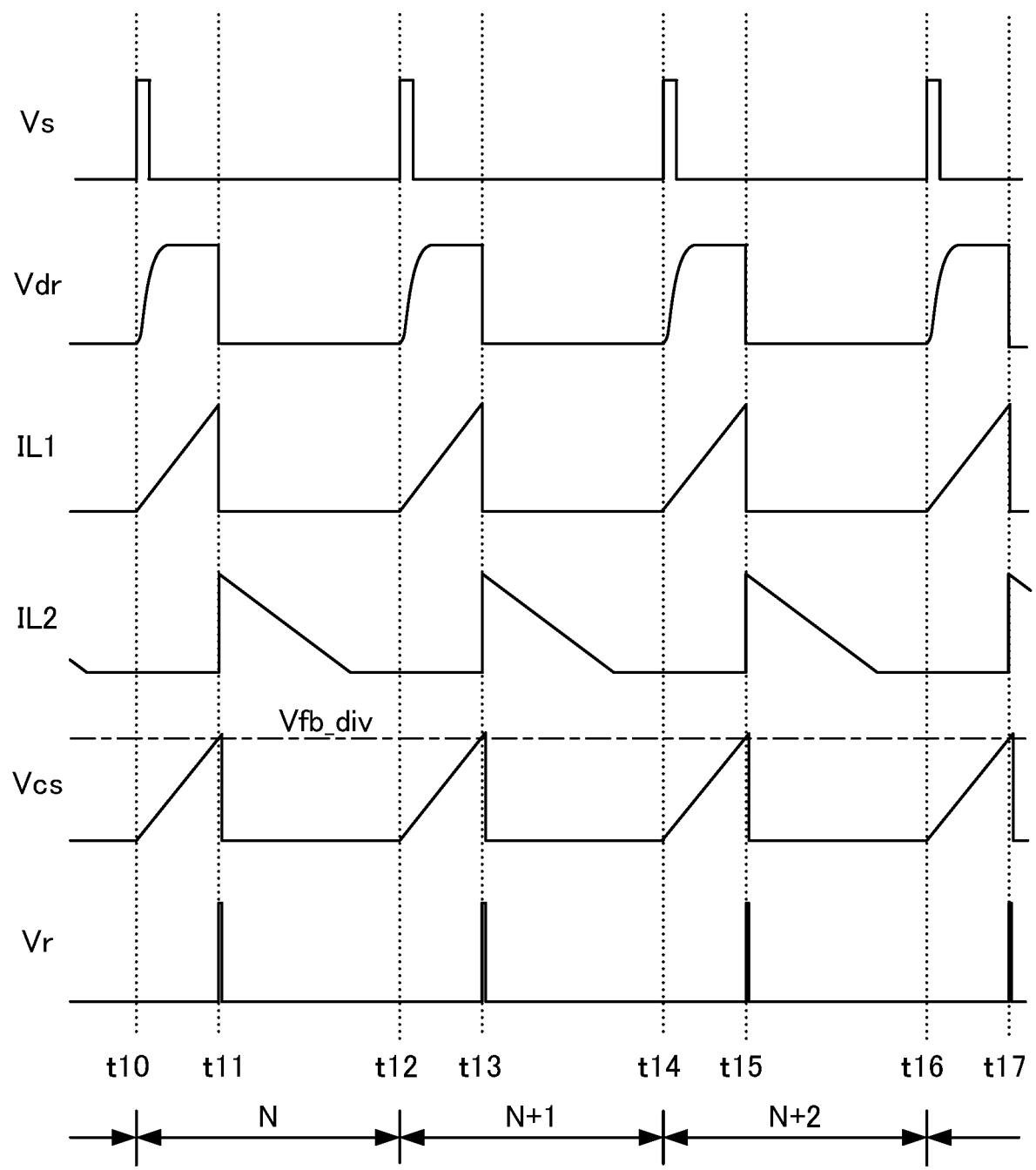
FIG. 4 is a diagram illustrating an example of an operation of an AC-DC convertor 10 when operating discontinuously.

FIG. 4 is a diagram illustrating an operation of the switching control IC 22 when the switching control IC 22 causes the AC-DC convertor 10 to operate discontinuously. Note that a time period from time t10 to time t12 is referred to as Nth period, a time period from time t12 to time t14 is referred to as (N+1)th period, and a time period from time t14 to time t16 is referred to as (N+2)th period. First, the Nth period will be described below.

At time t10, the PWM oscillator 55 outputs the signal Vpwm with the switching frequency corresponding to the voltage Vfb. The one-shot circuit 56 outputs the signal Vs, which is a high one-shot pulse, at the rise of the signal Vpwm.

Upon receiving the signal Vs, which is the high one-shot pulse, the SR flip-flop 57 outputs the high signal IN. The drive circuit 60 thereby raises the voltage level of the signal Vdr and turns on the power transistor 23.

When the voltage level of the signal Vdr rises and the power transistor 23 is turned on, the inductor current IL1 flowing through the primary coil L1 increases without a positive offset because the AC-DC convertor 10 is operating discontinuously. Specifically, when the AC-DC convertor 10 is operating discontinuously, the inductor current IL1 increases from the state where the current has completely flowed out (that is, zero). The voltage Vcs generated with the inductor current IL1 flowing through the resistor 28 thereby increases without a positive offset, similarly to the inductor current IL1. In other words, the voltage Vcs also increases from zero.

Meanwhile, since the secondary coil L2 is electromagnetically coupled thereto with the opposite polarity and the diode 40 is caused to be off, the inductor current IL2 flowing through the secondary coil L2 does not flow when the power transistor 23 is on, and energy is stored in the transformer 24.

When the voltage Vcs exceeds the voltage Vfb_div at time t11, the comparator 59 outputs the high signal Vr. The SR flip-flop 57 thereby outputs the low signal IN, and the drive circuit 60 lowers the voltage level of the signal Vdr and turns off the power transistor 23.

When the voltage level of the signal Vdr drops and the power transistor 23 is turned off, the inductor current IL1 rapidly decreases. The energy stored in the transformer 24 is thereby outputted from the secondary coil L2 via the diode 40. When the power transistor 23 is turned on again at time t12 as at time t10, no inductor current IL2 is flowing because the AC-DC convertor 10 is operating discontinuously. The inductor current IL2 decreases at a fixed rate after being generated at the point of time t11, and reaches zero at somewhere between time t11 and time t12.

The operation from time t10 to time t12 is repeated in a time period from time t12 to time t17. Accordingly, in the discontinuous operation, the AC-DC convertor 10 operates such that the inductor current IL1 is zero upon turning on the power transistor 23. In the discontinuous operation, there is a time period during which neither the inductor current IL1 nor the inductor current IL2 is flowing as in a time period from time t11 to time t12, a time period from time t13 to time t14, and a time period from time t15 to time t16.

<<<Configuration of Drive Circuit 60>>>

Figure 5:
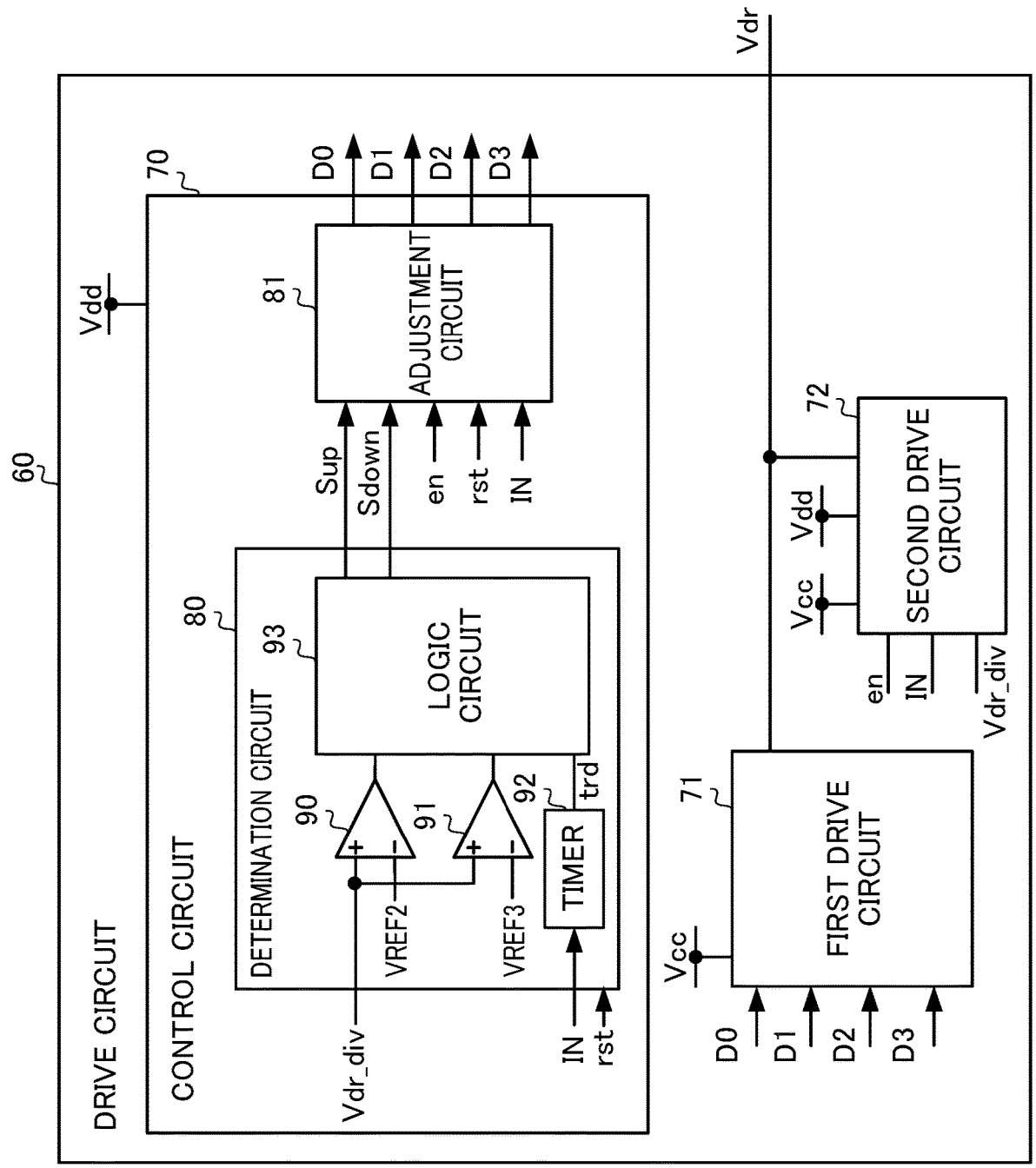
FIG. 5 is a diagram illustrating an example of a drive circuit 60.

FIG. 5 is a diagram illustrating an example of the drive circuit 60. The drive circuit 60 includes the control circuit 70, a first drive circuit 71, and the second drive circuit 72.

The control circuit 70 determines a time period during which the first drive circuit 71 drives the power transistor 23. Moreover, the control circuit 70 outputs signals D0 to D3, to control the first drive circuit 71.

The first drive circuit 71 is a voltage drive circuit that drives the power transistor 23 with a voltage, in response to the signals D0 and the like from the control circuit 70.

The second drive circuit 72 is a current drive circuit that drives the power transistor 23 with a current by supplying a current to the terminal OUT of the switching control IC 22 or receiving a current from the terminal OUT based on the voltage Vdr_div and the signals en and IN. Note that details of the control circuit 70, the first drive circuit 71, and the second drive circuit 72 will be described later.

<<<Configuration of Control Circuit 70>>>

The control circuit 70 includes a determination circuit 80 and an adjustment circuit 81, and outputs the signals D0 to D3 in response to the voltage Vdr_div, the signal IN, and the reset signal rst.

Moreover, the control circuit 70 controls the first drive circuit 71 by outputting the signals D0 and the like based on the voltage Vdr_div such that the voltage Vdr falls within a predetermined range, which will be described later.

The determination circuit 80 determines whether the voltage Vdr falls within the predetermined range (in other words, whether the voltage Vdr_div falls between the reference voltage VREF2 (e.g., 1.4 V) and a reference voltage VREF3 (e.g., 1.5V)).

Specifically, when the voltage Vdr_div is continuously higher than the reference voltage VREF3 during a time period in which a timer 92 (described later) outputs a rising edge of a clock signal trd three times, the determination circuit 80 outputs a low signal Sup and a high signal Sdown to the adjustment circuit 81, which will be described later. Meanwhile, when the voltage Vdr_div is continuously lower than the reference voltage VREF2 during the time period in which the timer 92 outputs the rising edge of the clock signal trd three times, the determination circuit 80 outputs a high signal Sup and a low signal Sdown to the adjustment circuit 81. In cases other than those described above, the determination circuit 80 outputs the low signal Sup and the low signal Sdown.

The determination circuit 80 includes comparators 90 and 91, the timer 92, and a logic circuit 93, and controls signals that are to be generated by the adjustment circuit 81, which will be described later.

The comparator 90 is a circuit that determines whether the voltage Vdr_div is higher than the reference voltage VREF2, and the comparator 91 is a circuit that determines whether the voltage Vdr_div is higher than the reference voltage VREF3.

The timer 92 is a circuit that outputs the clock signal trd for operating the determination circuit 80. When the signal IN goes high, the timer 92 outputs the high clock signal trd after a lapse of a predetermined time period ta. When the signal IN goes low, the timer 92 outputs the low clock signal trd. Note that the predetermined time period ta ta is shorter than a time period during which the signal IN is high.

The logic circuit 93 holds outputs of the comparators 90 and 91 at the rise of the clock signal trd from the timer 92. The logic circuit 93 outputs the high signal Sup and the low signal Sdown when the voltage Vdr_div is continuously lower than the reference voltage VREF2 during the time period in which the clock signal trd rises three times. Meanwhile, the logic circuit 93 outputs the low signal Sup and the high signal Sdown when the voltage Vdr_div is continuously higher than the reference voltage VREF3 during the time period in which the clock signal trd rises three times. Moreover, the logic circuit 93 outputs the low signal Sup and the low signal Sdown when the state where the voltage Vdr_div is lower than the reference voltage VREF2 or higher than the reference voltage VREF3 does not continue during the time period in which the clock signal trd rises three times.

The adjustment circuit 81 outputs the signals D0 to D3 for controlling the first drive circuit 71 in response to the signals Sup, Sdown, and en.

Moreover, when the signal Sup goes high, the adjustment circuit 81 increases a voltage drive period during which the first drive circuit 71 drives the power transistor 23 with a voltage. When the signal Sdown goes high, the adjustment circuit 81 reduces the voltage drive period. When the signals Sup and Sdown are low, the adjustment circuit 81 maintains the voltage drive period.

Specifically, the adjustment circuit 81 adjusts a time period during which the high control signals D0 to D2 are outputted, according to the length of the voltage drive period. Note that the configuration and operation of the first drive circuit 71 will be described later. Moreover, the determination circuit 80 corresponds to a "first determination circuit", and the signals Sup and Sdown correspond to a "result of determination".

<<<Configuration and Operation of First Drive Circuit 71 and Operation of Adjustment Circuit 81>>>

Figure 6:
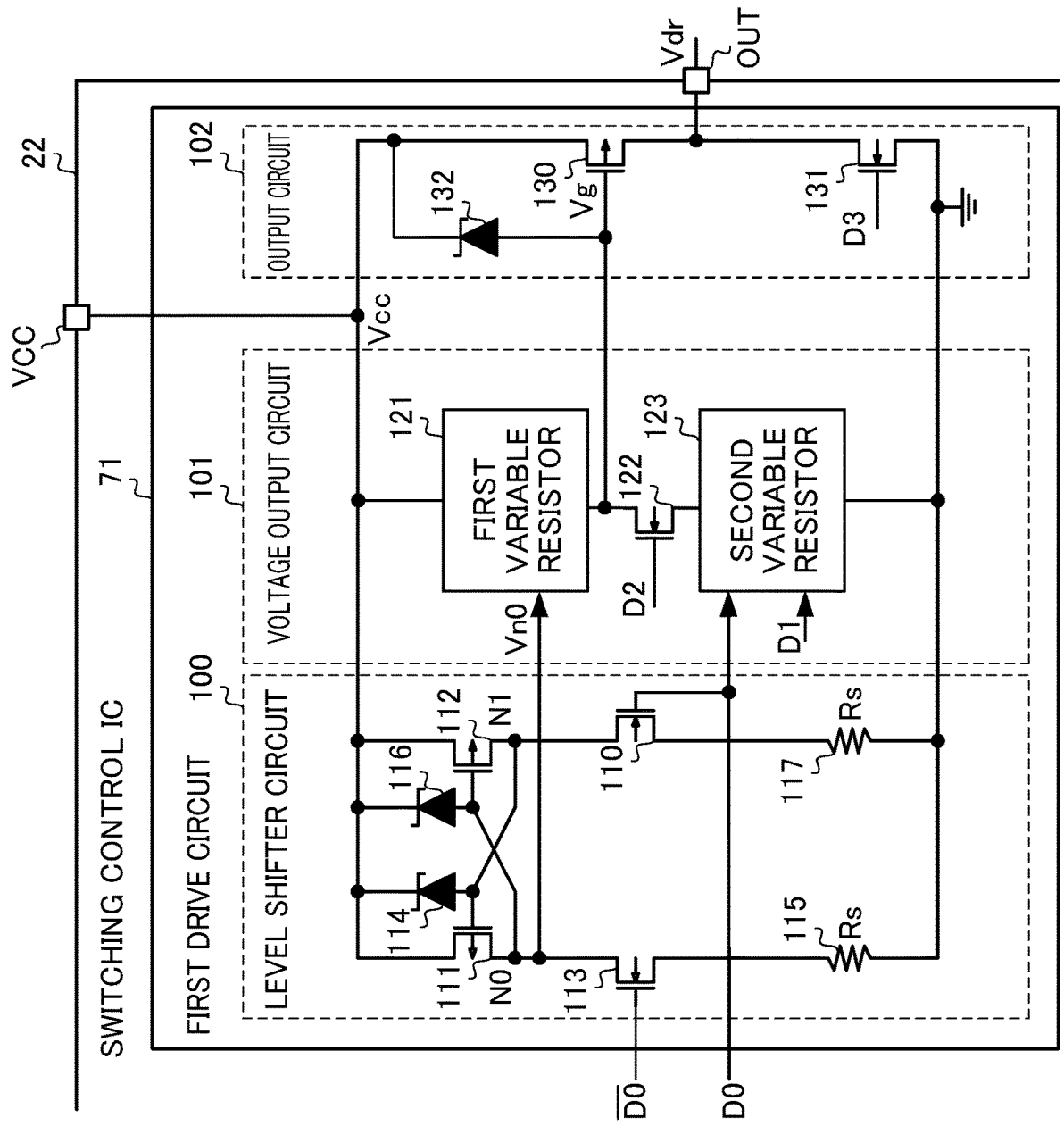
FIG. 6 is a diagram illustrating an example of a first drive circuit 71.

FIG. 6 is a diagram illustrating an example of the first drive circuit 71. When the determination circuit 80 outputs the high signal Sup in a state where the enable circuit 54 outputs the high signal en, the adjustment circuit 81 increases the time period during which the control signals D0 to D2 are high. Meanwhile, when the determination circuit 80 outputs the high signal Sdown in a state where the enable circuit 54 outputs the high signal en, the adjustment circuit 81 reduces the time period during which the control signals D0 to D2 are high. Note that the time period during which any of the control signals D0 to D2 is high corresponds to the voltage drive period.

Moreover, when the enable circuit 54 outputs the high signal en and the SR flip-flop 57 outputs the high signal IN, the adjustment circuit 81 outputs the control signals D0 and the like to the first drive circuit 71 so as to make sequential transition in four states of a state 1, a state 2, a state 3, and a no-drive state. Logic levels of the control signals D0 to D3 in each state are as illustrated in FIG. 7 and will be described below.

As illustrated in FIG. 7, in the state 1, the adjustment circuit 81 sets the control signals D0 to D2 to high and the control signal D3 to low. In the state 2, the adjustment circuit 81 sets the control signal D0 to low, the control signals D1 and D2 to high, and the control signal D3 to low. In the state 3, the adjustment circuit 81 sets the control signals D0 and D1 to low, the control signal D2 to high, and the control signal D3 to low. In the no-drive state, the adjustment circuit 81 sets the control signals D0 to D2 to low and the control signal D3 to low.

Meanwhile, as illustrated in FIG. 7, when the enable circuit 54 outputs the low signal en and the SR flip-flop 57 outputs the high signal IN, the adjustment circuit 81 outputs the control signals D0 and the like to the first drive circuit 71 so as to make sequential transition two states of a state 4 and a state 5. Logic levels of the control signals D0 and the like in the state 4 are the same as those in the state 1, and logic levels in the state 5 are the same as those in the state 3.

Moreover, as illustrated in FIG. 7, when the SR flip-flop 57 outputs the low signal IN, the logic levels of the control signals D0 to D2 are set to low and the logic level of the control signal D3 is set to high, irrespective of the logic level of the signal en.

The first drive circuit 71 drives the power transistor 23 with a voltage, and includes a level shifter circuit 100, a voltage output circuit 101, and an output circuit 102.

The level shifter circuit 100 converts the control signal D0 operating with the voltage Vdd into a signal Vn0 operating with the power supply voltage Vcc. The level shifter circuit 100 includes NMOS transistors 110 and 113, PMOS (P-type Metal-Oxide-Semiconductor) transistors 111 and 112, resistors 115 and 117, and Zener diodes 114 and 116.

In other words, the level shifter circuit 100 outputs the signal Vn0 having the logic level of the control signal D0. Specifically, the level shifter circuit 100 outputs a high signal Vn0 in response to the control circuit 70 outputting the high control signal D0, and outputs a low signal Vn0 in response to the control circuit 70 outputting the low control signal D0.

The voltage output circuit 101 controls a gate voltage Vg of a PMOS transistor 130 (described later) in the output circuit 102 in response to the control signals D0 to D2 and the signal Vn0. The voltage output circuit 101 includes a first variable resistor 121, an NMOS transistor 122, and a second variable resistor 123. Note that the first variable resistor 121, the NMOS transistor 122, and the second variable resistor 123 correspond to a "voltage divider circuit".

The first variable resistor 121 is a circuit that changes its resistance value in response to the signal Vn0, and the second variable resistor 123 is a circuit that changes its resistance value in response to the control signals D0 and D1, and limits a current flowing through a Zener diode 132 (described later). The second variable resistor 123 is coupled to the first variable resistor 121 via the NMOS transistor 122, in the states 1 to 3 in which the control signal D2 is high. Note that the NMOS transistor 122 corresponds to a "second transistor".

Specifically, in the state 1, the first variable resistor 121 and the second variable resistor 123 generate the minimum gate voltage Vg of the PMOS transistor 130, thereby maximizing the driving capability of the PMOS transistor 130. Then, as the state transitions from the state 2 to the state 3, the first variable resistor 121 and the second variable resistor 123 raise the gate voltage Vg, thereby reducing the driving capability of the PMOS transistor 130. In the no-drive state, the first variable resistor 121 and the second variable resistor 123 apply the gate voltage Vg that is the voltage Vcc to the PMOS transistor 130, and stop the driving of the terminal OUT performed by the PMOS transistor 130. Note that operations in the states 4 and 5 are the same as in the states 1 and 3, respectively.

The output circuit 102 is configured such that the PMOS transistor 130 to which the gate voltage Vg is applied drives the terminal OUT with a voltage, and includes the PMOS transistor 130, an NMOS transistor 131, and the Zener diode 132.

<<<Operation of First Drive Circuit 71 when Signal IN is High and Signal en is High>>>

When the signal IN is high and the signal en is high, the first drive circuit 71 operates so as to go through the four states of the states 1, 2, and 3, and no-drive state.

In the aforementioned configuration, upon the output of the high signal en by the enable circuit 54, the first drive circuit 71 reduces the driving capability of the PMOS transistor 130 in a stepwise manner and increases the on-resistance of the PMOS transistor 130 in a stepwise manner, with the rise in the gate voltage Vg according to the transition of the state from the state 1 to the no-drive state. Here, the "driving capability" is capability as to how much current the PMOS transistor 130 can output to the terminal OUT.

Specifically, in the state 1, the first drive circuit 71 applies the minimum gate voltage Vg to the PMOS transistor 130, to provide the maximum driving capability to the PMOS transistor 130 and minimize the on-resistance of the PMOS transistor 130.

Then, in the state 2, the first drive circuit 71 applies the gate voltage Vg higher than that in the state 1 to the PMOS transistor 130, to provide driving capability lower than that in the state 1 to the PMOS transistor 130, and increase the on-resistance of the PMOS transistor 130 more than that in the state 1.

Next, in the state 3, the first drive circuit 71 applies the gate voltage Vg higher than that in the state 2 to the PMOS transistor 130, to provide driving capability lower than that in the state 2 to the PMOS transistor 130, and increase the on-resistance of the PMOS transistor 130 more than that in the state 2.

Lastly, in the no-drive state, the first drive circuit 71 applies the gate voltage Vg that is the power supply voltage Vcc to the PMOS transistor 130, to turn off the PMOS transistor 130, and maximize the on-resistance of the PMOS transistor 130.

Specifically, the following describes an operation of the first drive circuit 71 in each of the state 1 to the no-drive state and how the gate voltage Vg changes.

<<<<Operation of First Drive Circuit in State 1>>>>

In the state 1, the control circuit 70 causes the control signals D0 to D2 to be high and the control signal D3 to be low.

Accordingly, when the control circuit 70 outputs the high control signal D0, the level shifter circuit 100 in the state 1 operates such that the NMOS transistor 110 is turned on and a logic level at a node N1 goes low. Then, the PMOS transistor 111 is turned on and a node N0 goes high. As a result, the PMOS transistor 112 is turned off and the level shifter circuit 100 outputs the high signal Vn0.

Moreover, the Zener diode 114 is coupled between the gate and the source of the PMOS transistor 111 as a clamp element. The Zener diode 114 is a circuit that protects the PMOS transistor 111 such that no excessive voltage is applied between the gate and the source of the PMOS transistor 111 while the PMOS transistor 111 is on.

However, when the PMOS transistor 111 is turned on, a potential difference between the power supply voltage Vcc and the node N1 having a lowered potential is applied to both ends of the Zener diode 114. Hence, there is a possibility that: a current flowing through the Zener diode 114 increases; the voltage to be clamped by the Zener diode 114 becomes excessively high; and the gate-source voltage of the PMOS transistor 111 exceeds the withstand voltage of the PMOS transistor 111.

Moreover, the current flowing through the Zener diode 114 is limited by a resistance value Rs to avoid the gate-source voltage of the PMOS transistor 111 from exceeding the withstand voltage of the PMOS transistor 111.

When the level shifter circuit 100 outputs the high signal Vn0, the first variable resistor 121 raises the gate voltage Vg of the PMOS transistor 130 to the voltage Vcc. However, since the NMOS transistor 122 is on in response to the high control signal D2, the second variable resistor 123 is connected to the first variable resistor 121. Accordingly, the gate voltage Vg of the PMOS transistor 130 results in the minimum voltage that is generated based on the voltage Vcc by the first variable resistor 121, the second variable resistor 123, and the Zener diode 132.

At this time, it is assumed that the resistance value of the second variable resistor 123 is R2a. Since the high signal D2 (i.e., signal D2 at 5 V) is inputted to the gate electrode of the NMOS transistor 122, the potential of the source electrode of the NMOS transistor 122 results in 5 V−Vgs, where, Vgs is the voltage between the gate and the source of the NMOS transistor 122.

The potential of the source electrode of the NMOS transistor 122 does not change even if the power supply voltage Vcc changes. Accordingly, a current Ids122a flowing through the NMOS transistor 122 does not change similarly, resulting in a current that lowers the voltage at the gate electrode of the PMOS transistor 130. Moreover, the impedance between the power supply voltage Vcc and the gate electrode of the PMOS transistor 130 is a composite value of a resistance value of the Zener diode 132 and a resistance value R1a of the first variable resistor 121, the Zener diode 132 and the first variable resistor 121 being coupled in parallel.

Accordingly, the gate voltage Vg of the PMOS transistor $$Vg=Vcc-(Vz+Rz+Ids122a)/(1+Rz/R1a) \qquad (1).$$

In this expression, Vz is a voltage when the current starts flowing through the Zener diode 132, Rz is an operation resistance of the Zener diode 132, and the current Ids122a is the current that lowers the voltage at the gate electrode of the PMOS transistor 130 in the state 1 (i.e., the current between the drain and the source of the NMOS transistor 122).

The output circuit 102 applies the gate voltage Vg outputted from the voltage output circuit 101, to the PMOS transistor 130, to generate the voltage Vdr. Note that since the control signal D3 is low, the NMOS transistor 131 is off.

<<<<Operation of First Drive Circuit in State 2>>>>

In the state 2, the control circuit 70 causes the control signal D0 to be low, the control signals D1 and D2 to be high, and the control signal D3 to be low.

Accordingly, when the control circuit 70 outputs the low control signal D0, the level shifter circuit 100 in the state 2 operates such that the NMOS transistor 113 is turned on and the logic level at the node N0 goes low. The PMOS transistor 112 is turned on and the level shifter circuit 100 outputs the low signal Vn0, as in the operation of the level shifter circuit 100 in the state 1 described above.

Then, the current flowing through the Zener diode 116 is limited by the resistance value Rs in a time period during which the control circuit 70 is in the state 2 and the control signal D0 is low.

When the level shifter circuit 100 outputs the low signal Vn0, the first variable resistor 121 raises the gate voltage Vg of the PMOS transistor 130 to the voltage Vcc. However, since the NMOS transistor 122 is on in response to the high control signal D2, the second variable resistor 123 is connected to the first variable resistor 121. Accordingly, the gate voltage Vg of the PMOS transistor 130 results in the voltage that is generated based on the voltage Vcc by the first variable resistor 121, the second variable resistor 123, and the Zener diode 132. The gate voltage Vg in this case is higher than the gate voltage Vg in the state 1.

At this time, since the Zener diode 132 and the first variable resistor 121 (it is assumed that the resistance value of the first variable resistor 121 is R1b) are coupled in parallel, the impedance between the voltage Vcc and the gate electrode of the PMOS transistor 130 results in the composite value of the resistance values of the Zener diode 132 and the first variable resistor 121. Note that the resistance value R1b is smaller than the resistance value R1a.

The resistance value of the second variable resistor 123 is R2b, and the value of a current Ids122b at this time is smaller than that of the current Ids122a. Note that the resistance value R2b is greater than the resistance value R2a.

Here, the current Ids122b is expressed as (5 V−Vgs2)/R2b. Note that the voltage Vgs2 is slightly lower than the voltage Vgs in the state 1, since the current Ids122b flowing through the NMOS transistor 122 is smaller than the current Ids122a in the state 1.

Accordingly, the gate voltage Vg of the PMOS transistor 130 is given by the following relational expression:

$$Vg=Vcc-(Vz+Rz+Ids122b)/(1+Rz/R1b) \qquad (2).$$

In this expression, Vz is the voltage when the current starts flowing through the Zener diode 132, and Rz is the operation resistance when the current flows through the Zener diode 132. Moreover, the current Ids122b is the current that lowers the voltage at the gate electrode of the PMOS transistor 130 in the state 2 (i.e., the current between the drain and the source of the NMOS transistor 122).

The output circuit 102 applies the gate voltage Vg outputted from the voltage output circuit 101, to the PMOS transistor 130, to generate the voltage Vdr. Note that since the control signal D3 is low, the NMOS transistor 131 is off.

<<<<Operation of First Drive Circuit in State 3>>>>

In the state 3, the control circuit 70 causes the control signals D0 and D1 to be low, the control signal D2 to be high, and the control signal D3 to be low.

Accordingly, when the control circuit 70 outputs the low control signal D0, the level shifter circuit 100 in the state 3 outputs the low signal Vn0 as in the state 2.

When the level shifter circuit 100 outputs the low signal Vn0, the first variable resistor 121 raises the gate voltage Vg of the PMOS transistor 130 to the voltage Vcc. However, since the NMOS transistor 122 is on in response to the high control signal D2, the second variable resistor 123 is connected to the first variable resistor 121. Accordingly, the gate voltage Vg of the PMOS transistor 130 results in the voltage that is generated based on the voltage Vcc by the first variable resistor 121, the second variable resistor 123, and the Zener diode 132. The gate voltage Vg in this case is higher than the gate voltage Vg in the state 2.

At this time, the resistance value of the second variable resistor 123 is R2c, and the value of a current Ids122c that lowers the voltage at the gate electrode of the PMOS transistor 130 at this time is even smaller than that of the current Ids122b. Note that the resistance value R2c is greater than the resistance value R2b.

Here, the current Ids122c is expressed as (5V−Vgs3)/R2c. Note that the voltage Vgs3 is slightly lower than the voltage Vgs2 in the state 2, since the current Ids122c flowing through the NMOS transistor 122 is smaller than the current Ids122b in the state 2.

Accordingly, the gate voltage Vg of the PMOS transistor 130 is given by the following relational expression:

$$Vg=Vcc-(Vz+Rz\times Ids122c)/(1+Rz/R1c) \qquad (3a).$$

In this expression, Vz is the voltage when the current starts flowing through the Zener diode 132, and Rz is the operation resistance when the current flows through the Zener diode 132. Moreover, the current Ids122c is the current that lowers the voltage at the gate electrode of the PMOS transistor 130 in the state 3 (i.e., the current between the drain and the source of the NMOS transistor 122).

Moreover, when the voltage difference between the voltage Vg and the power supply voltage Vcc becomes smaller than the voltage Vz and no current flows through the Zener diode 132, the gate voltage Vg of the PMOS transistor 130 is given by the following relational expression:

$$Vg=Vcc-R1b\times Ids122c \qquad (3b).$$

The output circuit 102 applies the gate voltage Vg outputted from the voltage output circuit 101, to the PMOS transistor 130, to generate the voltage Vdr. Note that since the control signal D3 is low, the NMOS transistor 131 is off.

<<<<Operation of First Drive Circuit in No-Drive State>>>>

In the no-drive state, the control circuit 70 causes the control signals D0 to D2 to be low and the control signal D3 to be low.

Accordingly, in the no-drive state, the control signal D0 does not change from that in the state 3 and description of the level shifter circuit 100 is thus omitted.

When the level shifter circuit 100 outputs the low signal Vn0, the first variable resistor 121 raises the gate voltage Vg of the PMOS transistor 130 to the voltage Vcc. Since the NMOS transistor 122 is off in response to the low control signal D2, the second variable resistor 123 is not connected to the first variable resistor 121. Accordingly, the gate voltage Vg of the PMOS transistor 130 results in the voltage Vcc.

The output circuit 102 applies the gate voltage Vg outputted from the voltage output circuit 101, to the PMOS transistor 130, to generate the voltage Vdr. Note that since the control signal D3 is low, the NMOS transistor 131 is off.

As has been described, in the transition from the state 1 to the state 3, the driving capability of the PMOS transistor 130 is gradually reduced, and the gate voltage Vg and the on-resistance of the power transistor 23 gradually increase.

Moreover, the voltage drive period includes: the time period of the state 1 in which the driving capability is relatively high; and the time periods of the states 2 and 3, subsequent to the state 1, in which the driving capability is relatively low. Here, the time period in the state 1 corresponds to a "first sub-period", and the time periods in the states 2 and 3 correspond to a "second sub-period".

Note that, in the state 1, the gate voltage Vg of the PMOS transistor 130 is a voltage lower than the power supply voltage Vcc by about 5 V. Moreover, in the state 2, the gate voltage Vg of the PMOS transistor 130 is a voltage lower than the power supply voltage Vcc by about 3V and, in the state 3, is a voltage lower than the power supply voltage Vcc by about 2.5 V.

Accordingly, the driving capability of the PMOS transistor 130 is reduced in a stepwise manner and the on-resistance of the PMOS transistor 130 increases in a stepwise manner with the rise in the gate voltage Vg according to the transition of the state from the state 1 up to the no-drive state. In an embodiment of the present disclosure, the gate voltage Vg is changed in a stepwise manner, however the gate voltage Vg may be changed in a gradual manner.

<<<Operation of First Drive Circuit 71 when Signal IN is High and Signal en is Low>>>

When the signal IN is high and the signal en is low, the first drive circuit 71 operates so as to go through the two states of the states 4 and 5.

In the aforementioned configuration, in response to the output of the low signal en by the enable circuit 54, the first drive circuit 71 reduces the driving capability of the PMOS transistor 130 in a stepwise manner and increases the on-resistance of the PMOS transistor 130 in a stepwise manner with the rise in the gate voltage Vg according to the state transition from the state 4 to the state 5.

Specifically, in the state 4, the first drive circuit 71 applies the minimum gate voltage Vg to the PMOS transistor 130, to provide the maximum driving capability to the PMOS transistor 130 and minimize the on-resistance of the PMOS transistor 130.

Then, in the state 5, the first drive circuit 71 applies the gate voltage Vg higher than that in the state 4 to the PMOS transistor 130, to provide driving capability lower than that in the state 4 to the PMOS transistor 130, and increase the on-resistance of the PMOS transistor 130 more than that in the state 4.

Specifically, the following describes an operation of the first drive circuit 71 in each of the states 4 and 5 and how the gate voltage Vg changes.

<<<<Operation of First Drive Circuit in State 4>>>>

In the state 4, the control circuit 70 causes the control signals D0 to D2 to be high and the control signal D3 to be low, as in the state 1.

Accordingly, when the control circuit 70 outputs the high control signal D0, the level shifter circuit 100 in the state 4 operates such that the NMOS transistor 110 is turned on and the logic level at the node N1 goes low. Thus, the level shifter circuit 100 operates such that the PMOS transistor 111 is turned on and the node N0 goes high resulting in the PMOS transistor 112 being turned off. Then, the level shifter circuit 100 outputs the high signal Vn0.

When the level shifter circuit 100 outputs the high signal Vn0, the first variable resistor 121 raises the gate voltage Vg of the PMOS transistor 130 to the voltage Vcc. However, since the NMOS transistor 122 is on in response to the high control signal D2, the second variable resistor 123 is connected to the first variable resistor 121. Accordingly, the gate voltage Vg of the PMOS transistor 130 results in the minimum voltage that is generated based on the voltage Vcc by the first variable resistor 121, the second variable resistor 123, and the Zener diode 132. The gate voltage Vg at this time is generated based on the relational expression (1) in the state 1.

The output circuit 102 applies the gate voltage Vg outputted from the voltage output circuit 101, to the PMOS transistor 130, to generate the voltage Vdr. Note that since the control signal D3 is low, the NMOS transistor 131 is off.

<<<<Operation of First Drive Circuit in State 5>>>>

In the state 5, the control circuit 70 causes the control signals D0 and D1 to be low, the control signal D2 to be high, and the control signal D3 to be low, as in the state 3.

Accordingly, when the control circuit 70 outputs the low control signal D0, the level shifter circuit 100 in the state 5 operates such that the NMOS transistor 113 is turned on and the logic level at the node N0 goes low. Thus, the level shifter circuit 100 outputs the low signal Vn0.

When the level shifter circuit 100 outputs the low signal Vn0, the first variable resistor 121 raises the gate voltage Vg of the PMOS transistor 130 to the voltage Vcc. However, since the NMOS transistor 122 is on in response to the high control signal D2, the second variable resistor 123 is connected to the first variable resistor 121. Accordingly, the gate voltage Vg of the PMOS transistor 130 results in the voltage that is generated based on the voltage Vcc by the first variable resistor 121, the second variable resistor 123, and the Zener diode 132. The gate voltage Vg in this case is higher than the gate voltage Vg in the state 4. The gate voltage Vg at this time is generated based on the relational expression (3a) or (3b) in the state 3.

The output circuit 102 applies the gate voltage Vg outputted from the voltage output circuit 101, to the PMOS transistor 130, to generate the voltage Vdr. Note that since the control signal D3 is low, the NMOS transistor 131 is off.

As has been described, in the transition from the state 4 to the state 5, the driving capability of the PMOS transistor 130 is reduced, and the gate voltage Vg and the on-resistance of the power transistor 23 increase.

Moreover, the voltage drive period includes: the time period of the state 4 in which the driving capability is relatively high; and the time period of the state 5, subsequent to the state 4, in which the driving capability is relatively low. Here, the time period in the state 4 corresponds to the "first sub-period", and the time period in the state 5 corresponds to the "second sub-period".

Accordingly, the driving capability of the PMOS transistor 130 is changed in a stepwise manner, and the on-resistance of the PMOS transistor 130 is also changed in a stepwise manner with the change in the gate voltage Vg according to the transition of the state from the state 4 to the state 5. At this time, the voltage Vdr results in the power supply voltage Vcc.

<<<Operation of First Drive Circuit 71 when Signal IN is Low>>>

When the signal IN is low, the control circuit 70 outputs the high control signal D3, and thus the first drive circuit 71 operates such that the voltage Vdr reaches the ground level via the terminal OUT. When the signal IN is low, the control signals D0 to D2 are low and the control signal D3 is high, irrespective of the logic level of the signal en. The following describes an operation of the first drive circuit 71 in the case where the signal IN is low.

When the control circuit 70 outputs the low control signal D0, the level shifter circuit 100 in the state where the signal IN is low operates such that the NMOS transistor 113 is turned on and the logic level at the node N0 goes low. Then, the PMOS transistor 112 is turned on and the node N1 goes high. As a result, the PMOS transistor 111 is turned off and the level shifter circuit 100 outputs the low signal Vn0.

When the level shifter circuit 100 outputs the low signal Vn0, the first variable resistor 121 raises the gate voltage Vg of the PMOS transistor 130 to the voltage Vcc. Then, since the NMOS transistor 122 is off in response to the low control signal D2, the second variable resistor 123 is not connected to the first variable resistor 121. Accordingly, the gate voltage Vg of the PMOS transistor 130 results in the voltage Vcc.

Since the control circuit 70 outputs the high control signal D3, the output circuit 102 turns on the NMOS transistor 131. At this time, the voltage Vdr is the ground voltage. Note that since the gate voltage Vg is the power supply voltage Vcc, the PMOS transistor 130 is off.

Note that the voltage drive period corresponds to a "first time period", the PMOS transistor 130 to a "first transistor", the gate electrode of the PMOS transistor 130 corresponds to a "control electrode", and the voltage Vg corresponds to a "divided voltage" and a "control voltage".

<<<Configuration and Operation of Second Drive Circuit 72>>>

Figure 8:
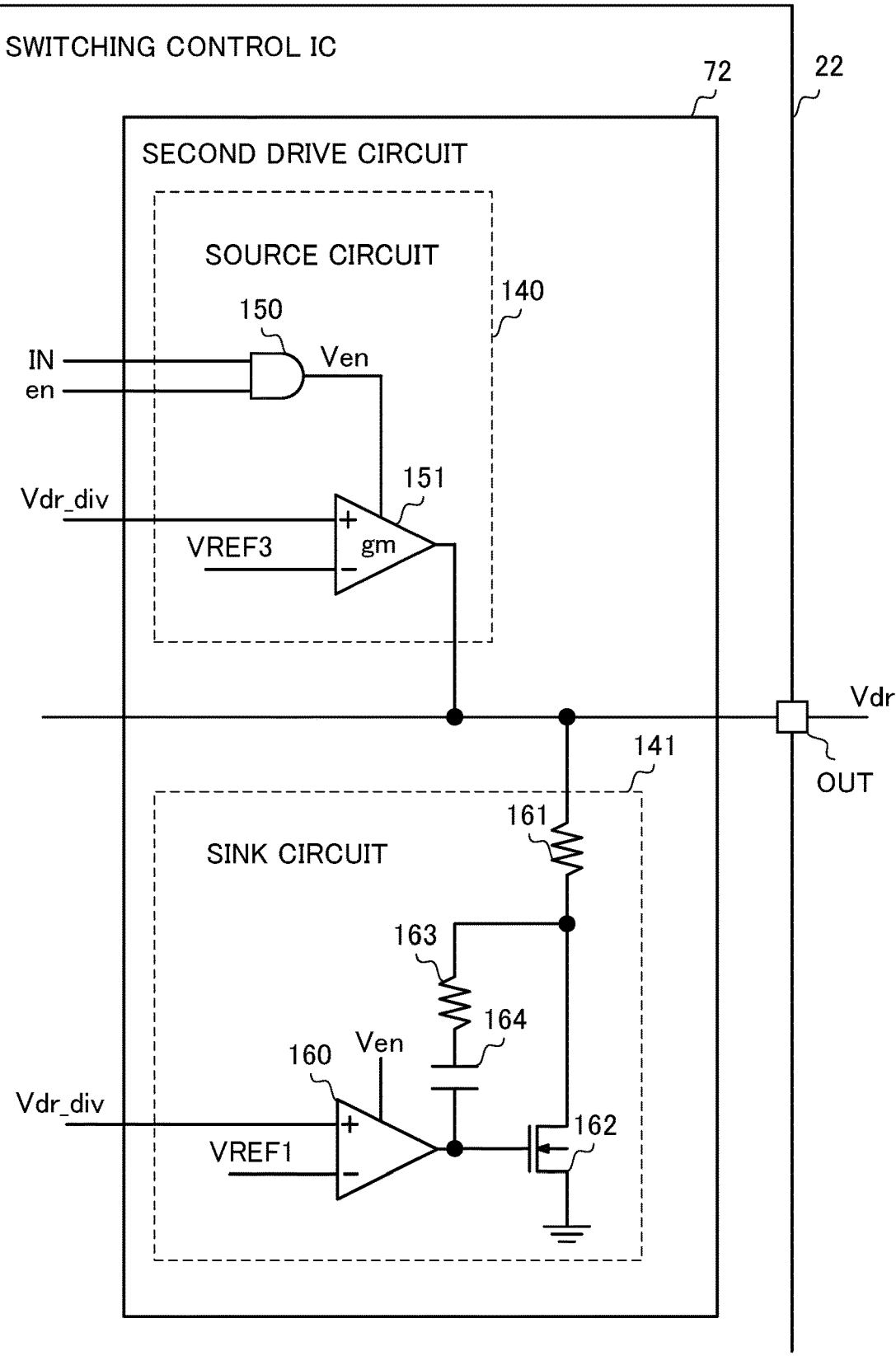
FIG. 8 is a diagram illustrating an example of a second drive circuit 72.

FIG. 8 is a diagram illustrating an example of the second drive circuit 72. When the signal IN is high and the signal en is high, the second drive circuit 72 supplies a source current to the terminal OUT and receives the sink current from the terminal OUT. The second drive circuit 72 includes a source circuit 140 and a sink circuit 141.

The source circuit 140 supplies the source current to the terminal OUT according to a difference between the voltage Vdr_div and the reference voltage VREF3 (e.g., 1.5 V). The source circuit 140 includes an AND circuit 150, and a voltage control current source circuit (operational transconductance amplifier) 151.

The AND circuit 150 takes a logical AND of the signal IN and the signal en and outputs the resultant as a signal Ven. When the signal Ven is high, the voltage control current source circuit 151 operates. Meanwhile, when the signal Ven is low, the voltage control current source circuit 151 stops operating. Note that a time period during which the signal Ven is high is referred to as a current drive period. Moreover, the current drive period is longer than the voltage drive period, and includes at least part of the voltage drive period.

The voltage control current source circuit 151 supplies the source current to the terminal OUT according to the difference between the voltage Vdr_div and the reference voltage VREF3, to operate such that the voltage Vdr_div becomes equal to the reference voltage VREF3.

Accordingly, when the voltage Vdr_div is higher than the reference voltage VREF3, the source current is stopped. Meanwhile, when the voltage Vdr_div is lower than the reference voltage VREF3, the source current increases and the voltage Vdr is gradually increased. Note that the reference voltage VREF3 is set to be higher than the threshold of the power transistor 23 and lower than the withstand voltage of the power transistor 23. Here, the "withstand voltage" refers to the withstand voltage between the gate and the source of the power transistor 23. Moreover, the reference voltage VREF3 corresponds to a "first level".

The sink circuit 141 generates the sink current that receives a current from the terminal OUT according to a difference between the voltage Vdr_div and the reference voltage VREF1 (e.g., 1.6 V). The sink circuit 141 includes a comparator 160, a resistor 161 for current limitation, an NMOS transistor 162 which is an output transistor, a resistor 163 for phase compensation, and a capacitor 164. Note that, in an embodiment of the present disclosure, the comparator 160 is used, however, an operational amplifier may be used instead.

The comparator 160 is designed to operate when the signal Ven is high, and turn off the NMOS transistor 162 without operating when the signal Ven is low, and thus the sink current does not flow. In other words, when the signal Ven is low, the sink circuit 141 stops operating.

Specifically, when the voltage Vdr_div is higher than the reference voltage VREF1, the comparator 160 supplies a current to the gate electrode of the NMOS transistor 162 and reduces the on-resistance of the NMOS transistor 162. In contrast, when the voltage Vdr_div is lower than the reference voltage VREF1, the comparator 160 receives a current from the gate electrode of the NMOS transistor 162 and increases the on-resistance of the NMOS transistor 162.

When the on-resistance of the NMOS transistor 162 decreases, the sink circuit 141 receives a larger sink current from the terminal OUT via the resistor 161. In contrast, when the on-resistance of the NMOS transistor 162 increases, the sink circuit 141 receives from the terminal OUT a sink current smaller than that when the on-resistance of the NMOS transistor 162 is low.

Accordingly, when the voltage Vdr_div is higher than the reference voltage VREF1, the sink current increases more than that when the voltage Vdr_div is lower than the reference voltage VREF1. In other words, the higher the voltage Vdr_div is than the reference voltage VREF1, the more the sink current increases, thereby being able to restrain the rise in the voltage Vdr. Note that the reference voltage VREF1 is set to be higher than the reference voltage VREF3 and lower than the withstand voltage of the power transistor 23.

Moreover, the driving capability of the second drive circuit 72 is lower than the driving capability of the first drive circuit 71. Note that the current drive period corresponds to a "second time period", a time period during which the control signal D2 is high while the signal en is low corresponds to a "third time period", and the reference voltage VREF1 corresponds to a "second level".

<<<Operation Example of Switching Control IC 22 when Signal en is High>>>

The following describes an operation of the switching control IC 22 when the signal en is high. Note that, in FIGS. 9 and 10, an output current Iout is illustrated such that the current outputted from the terminal OUT is a negative current.

Figure 9:
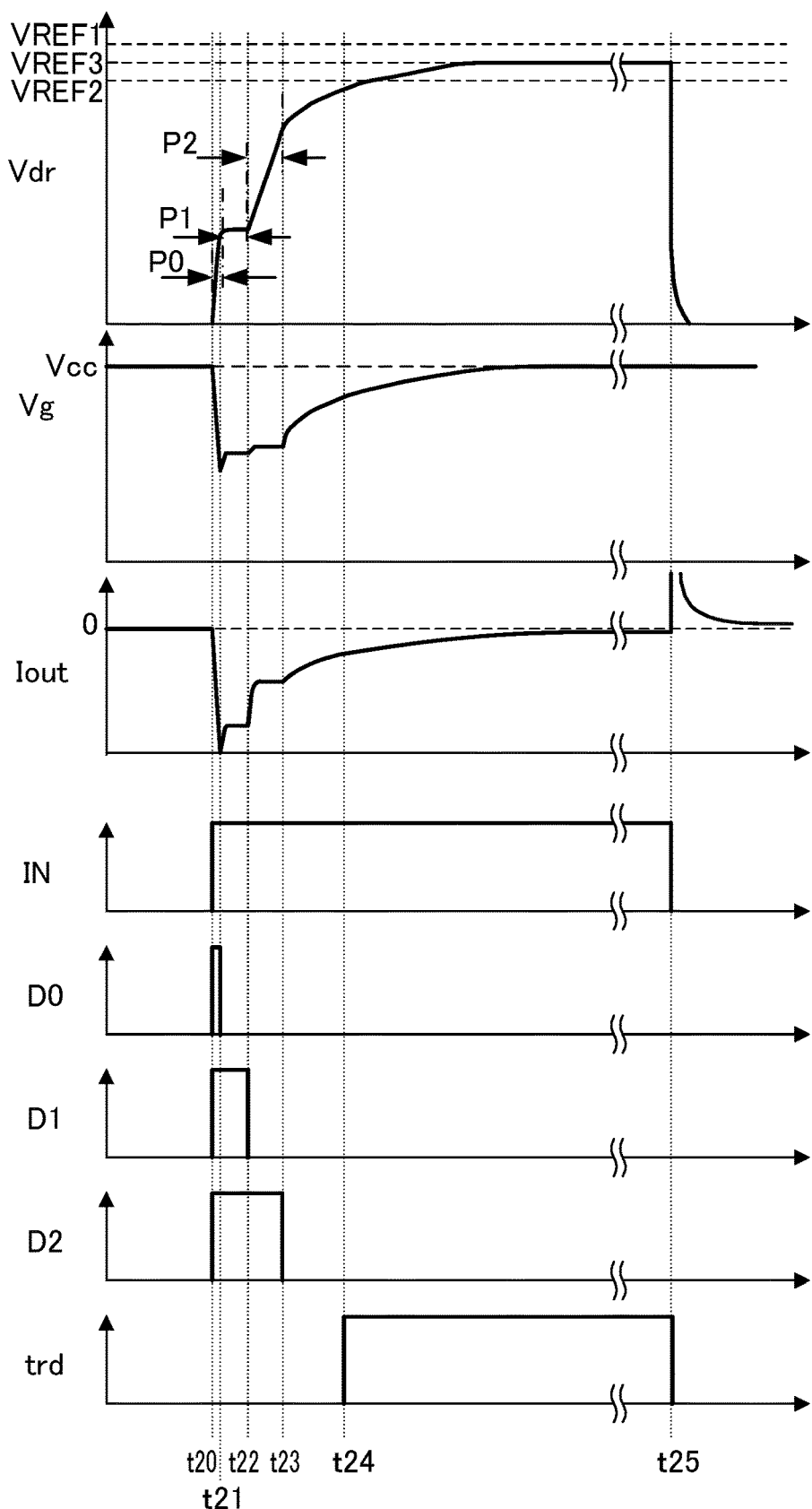
FIG. 9 is a diagram illustrating an example of an operation of a switching control IC 22 when a voltage Vdr is lower than a lower-limit level.

FIG. 9 is a diagram illustrating an example of an operation of the switching control IC 22 when the voltage Vdr is lower than a lower-limit level. Moreover, FIG. 9 is a diagram illustrating an operation of the switching control IC 22 in the case where the reset signal rst goes high and the voltage drive period is in an initial state.

When the SR flip-flop 57 outputs the high signal IN at time t20, the adjustment circuit 81 outputs the high control signals D0 to D2 in the state 1 and the voltage drive period starts. At this time, the adjustment circuit 81 outputs the low control signal D3.

Moreover, the second drive circuit 72 supplies the source current to the terminal OUT according to the voltage Vdr_div. Then, the timer 92 starts measuring the predetermined time period ta.

At this time, the gate voltage Vg of the PMOS transistor 130 is the minimum, the driving capability of the PMOS transistor 130 is the maximum, the on-resistance is the minimum, and the output current Iout is the maximum. As a result, the voltage Vdr increases with the maximum slope.

Note that a parasitic capacitance Cgs between the gate and the source of the power transistor 23 is charged with a current corresponding to the gate voltage Vg of the PMOS transistor 130 during a time period P0 illustrated in FIG. 9 until the power transistor 23 switches from the off state to the on state, and thus the voltage Vdr rapidly rises.

At time t21, the adjustment circuit 81 outputs the low control signal D0 in the state 2.

At this time, the gate voltage Vg of the PMOS transistor 130 becomes higher than the voltage in the state 1, and the driving capability of the PMOS transistor 130 decreases, the on-resistance increases, and the output current Iout decreases, as compared with those in the state 1. As a result, the voltage Vdr remains flat.

Note that, since the power transistor 23 is on in the time period P1, the voltage at the drain electrode of the power transistor 23 falls. At this time, a parasitic capacitance Cgd between the gate and the drain of the power transistor 23 is charged with the current corresponding to the gate voltage Vg of the PMOS transistor 130. Accordingly, charging of the parasitic capacitance Cgd and reduction in the voltage at the drain of the power transistor 23 caused by turning on the power transistor 23 reach equilibrium, and thus the voltage Vdr remains flat.

At time t22, the adjustment circuit 81 outputs the low control signal D1 in the state 3.

At this time, the gate voltage Vg of the PMOS transistor 130 becomes higher than the voltage in the state 2, and the driving capability of the PMOS transistor 130 further decreases, the on-resistance further increases, and the output current Iout further decreases, as compared with those in the states 1 and 2. As a result, the voltage Vdr rises with a slope smaller than that in the state 1.

Note that the voltage at the drain of the power transistor 23 sufficiently comes close to the ground voltage during the time period P2. With the parasitic capacitances Cgd and Cgs of the power transistor 23 being charged with the current corresponding to the gate voltage Vg of the PMOS transistor 130, the voltage Vdr rises. Since the gate voltage Vg of the PMOS transistor 130 is higher than that in the time period P0, the rise in the voltage Vdr is gradual.

In the time periods P1 and P2, the first drive circuit 71 charges the parasitic capacitances of the power transistor 23 while reducing the driving capability during the voltage drive period to turn on the power transistor 23, and after such charging as describe above and the change in the voltage level at the output electrode of the power transistor 23 reach equilibrium, the first drive circuit 71 further charges the parasitic capacitances of the power transistor 23.

As a result, the first drive circuit 71 discontinuously changes the rate of increase of the voltage Vdr for driving the power transistor 23 to turn on the power transistor 23. In other words, the voltage Vdr rises with a large slope A1, based on a charge current for turning on the power transistor 23. Then, when the power transistor 23 is turned on, a slope A2 of the voltage Vdr decreases based on a change in the charge current caused by turning on the power transistor 23 and the voltage Vdr becomes almost flat. Thereafter, when the power transistor 23 is turned on with the charge current, the change in the charge current is stabilized, and the voltage Vdr rises with a slope A3 smaller than the slope A1. Accordingly, the voltage Vdr rises with two inflection points. Note that, in an embodiment of the present disclosure, the "inflection point" refers to a point at which the slope of the voltage Vdr changes.

At time t23, the adjustment circuit 81 outputs the low control signal D2 in the no-drive state, and the voltage drive period ends.

At this time, the gate voltage Vg of the PMOS transistor 130 is pulled up so as to gradually reach the power supply voltage Vcc.

At time t24, at which the predetermined time period to has elapsed since the time t20, the timer 92 outputs the high clock signal trd.

At this time, the voltage Vdr is lower than the lower-limit level (i.e., the voltage Vdr_div is lower than the reference voltage VREF2). Accordingly, if the voltage Vdr_div is lower than the reference voltage VREF2 at the rising edge of the clock signal trd two more times, the determination circuit 80 outputs the signal Sup.

When the SR flip-flop 57 outputs the low signal IN at time t25, the timer 92 outputs the low clock signal trd.

Moreover, the second drive circuit 72 stops supplying the source current to the terminal OUT according to the voltage Vdr_div.

Figure 10:
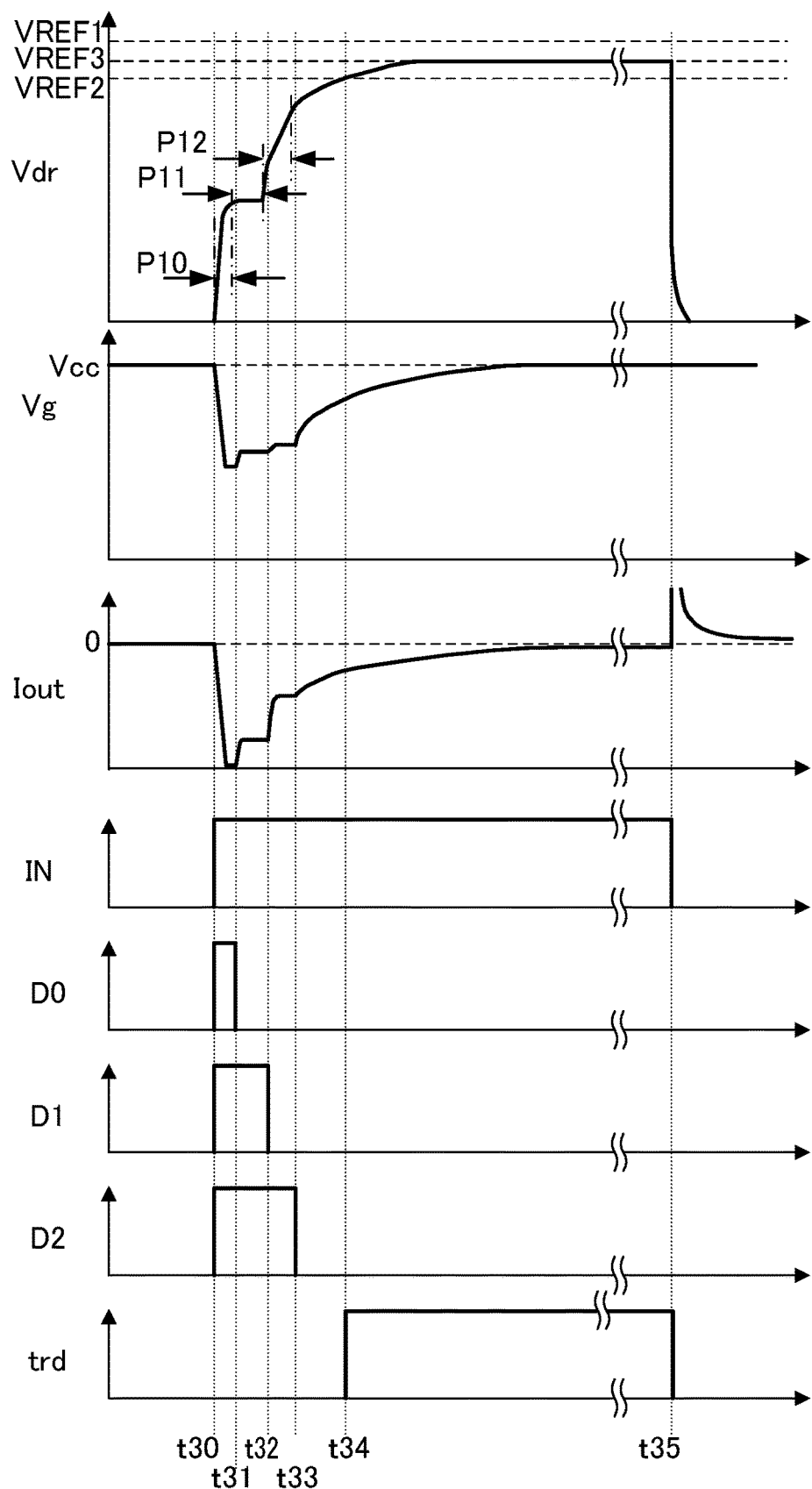
FIG. 10 is a diagram illustrating an example of an operation of a switching control IC 22 when causing a voltage Vdr to be equal to or higher than a lower-limit level.

FIG. 10 is a diagram illustrating an example of an operation of the switching control IC 22 when causing the voltage Vdr to be equal to or higher than the lower-limit level. Operations of the circuits from time t30 to time t35 are substantially the same as the operations of the circuits from time t20 to time t25 in FIG. 8. Note that causes of changes in the voltage Vdr in time periods P10 to P12 in FIG. 10 are similar to the causes of the changes in the voltage Vdr in the time periods P0 to P2 in FIG. 9.

FIG. 10 is different from FIG. 9 in that the voltage drive period increases after the output of the signal Sup by the determination circuit 80, which results in that the voltage Vdr exceeds the lower-limit level (i.e., the voltage Vdr_div exceeds the reference voltage VREF2) at time t34. Thus, the determination circuit 80 stops the output of the signal Sup at time t34.

Accordingly, when the voltage Vdr is lower than the lower-limit level, the switching control IC 22 can control the first drive circuit 71 and the second drive circuit 72 such that the voltage Vdr falls within a predetermined range.

Figure 11:
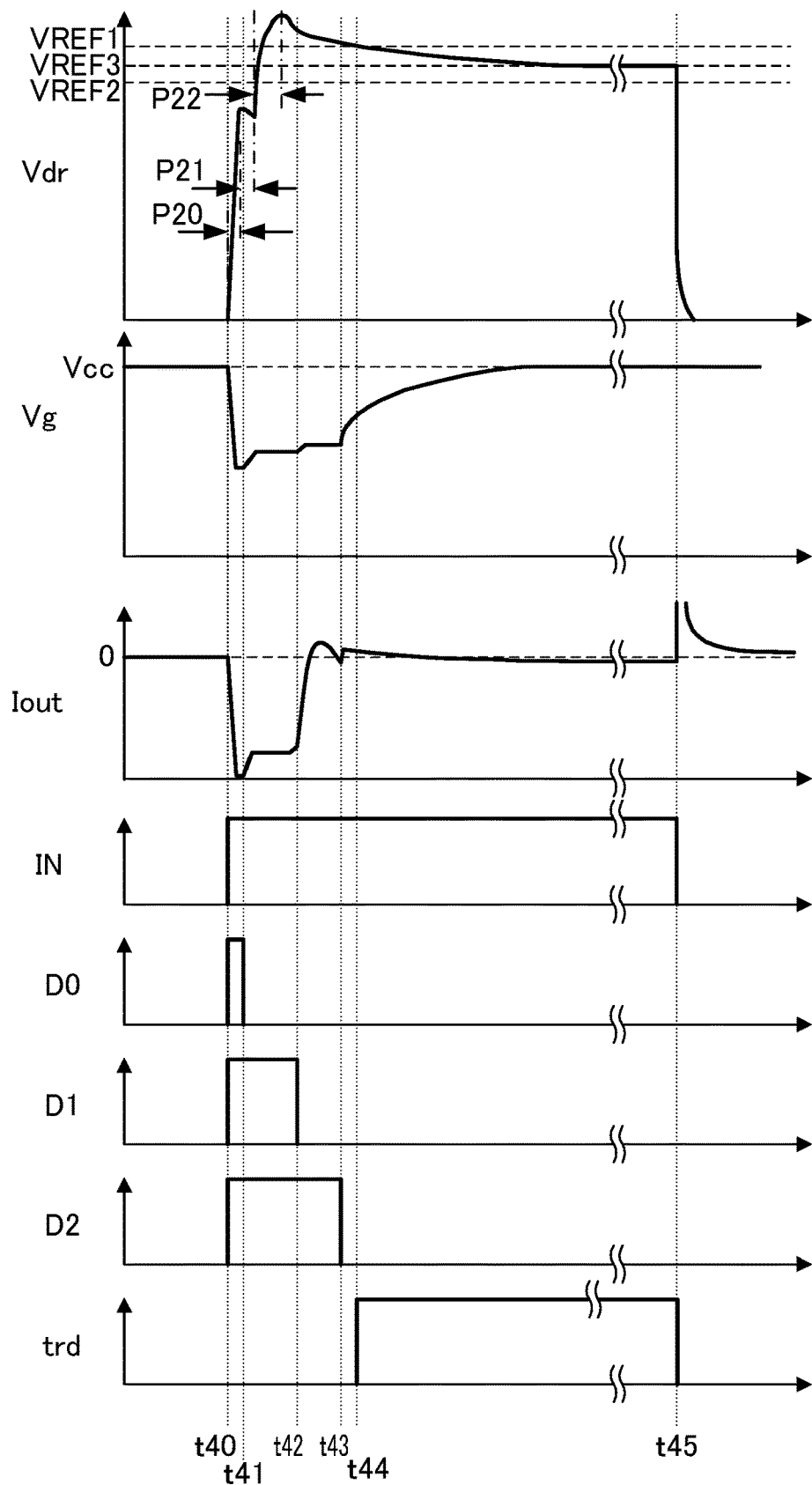
FIG. 11 is a diagram illustrating an example of an operation of a switching control IC 22 when a voltage Vdr is higher than an upper-limit level.

FIG. 11 is a diagram illustrating an example of an operation of the switching control IC 22 when the voltage Vdr is higher than an upper-limit level. Note that, in FIGS. 10 and 11, the output current Iout is illustrated such that the current outputted from the terminal OUT is a negative current.

When the SR flip-flop 57 outputs the high signal IN at time t40, the adjustment circuit 81 outputs the high control signals D0 to D2 in the state 1, and the voltage drive period starts. At this time, the adjustment circuit 81 outputs the low control signal D3.

Moreover, the second drive circuit 72 supplies the source current to the terminal OUT according to the voltage Vdr_div. Then, the timer 92 starts measuring the predetermined time period ta.

At this time, the gate voltage Vg of the PMOS transistor 130 is the minimum voltage, the driving capability of the PMOS transistor 130 is the maximum, the on-resistance is the minimum, and the output current Iout is the maximum. As a result, the voltage Vdr rises with the maximum slope.

Note that the parasitic capacitance Cgs between the gate and the source of the power transistor 23 is charged with the current corresponding to the gate voltage Vg of the PMOS transistor 130 during a time period P20 illustrated in FIG. 11 until the power transistor 23 switches from the off state to the on state, and thus the voltage Vdr rapidly rises.

At time t41, the adjustment circuit 81 outputs the low control signal D0 in the state 2.

At this time, the gate voltage Vg of the PMOS transistor 130 becomes higher than the voltage in the state 1, and the driving capability of the PMOS transistor 130 decreases, the on-resistance increases, and the output current Iout decreases, as compared with those in the state 1. As a result, the voltage Vdr slightly decreases.

Note that, since the power transistor 23 is on in the time period P21, the voltage at the drain electrode of the power transistor 23 falls. At this time, the parasitic capacitance Cgd between the gate and the drain of the power transistor 23 is charged with the current corresponding to the gate voltage Vg of the PMOS transistor 130. Accordingly, charging of the parasitic capacitance Cgd and reduction in the voltage at the drain of the power transistor 23 caused by turning on the power transistor 23 reach equilibrium.

However, since the resistor 163 for the phase compensation and the capacitor 164 in the sink circuit 141 are coupled to the gate electrode of the NMOS transistor 162, the gate voltage of the NMOS transistor 162 rapidly rises. The sink circuit 141 thereby operates, and thus the voltage Vdr slightly drops and changes so as to draw a curve protrude upward.

At time t42, the adjustment circuit 81 outputs the low control signal D1 in the state 3.

At this time, the gate voltage Vg of the PMOS transistor 130 becomes higher than the voltage in the state 2, and the driving capability of the PMOS transistor 130 further decreases, the on-resistance further increases, and the output current Iout further decreases as compared with those in the states 1 and 2. As a result, the voltage Vdr rises with a slope smaller than that in the state 1.

Note that the voltage at the drain electrode of the power transistor 23 sufficiently comes close to the ground voltage during the time period P22. With the parasitic capacitances Cgd and Cgs of the power transistor 23 being charged with the current corresponding to the gate voltage Vg of the PMOS transistor 130, the voltage Vdr rises. Since the gate voltage Vg of the PMOS transistor 130 is higher than that in the time period P20, the rise in the voltage Vdr is gradual.

However, since the capacitor 164 and the resistor 163 for the phase compensation in the sink circuit 141 are coupled to the gate electrode of the NMOS transistor 162, the gate voltage of the NMOS transistor 162 rapidly rises, as in the time period P21. The sink circuit 141 thereby operates, and thus the voltage Vdr slightly drops and changes so as to draw a curve protruding upward.

In the time periods P21 and P22, the first drive circuit 71 charges the parasitic capacitances of the power transistor 23 while reducing the driving capability during the voltage drive period to turn on the power transistor 23, and after such charging as describe above and the change in the voltage level at the output electrode of the power transistor 23 reach equilibrium, the first drive circuit 71 further charges the parasitic capacitances of the power transistor 23. At this time, the second drive circuit 72 generates the sink current to reduce the driving capability.

Accordingly, the first drive circuit 71 discontinuously raises the voltage Vdr for driving the power transistor 23 to turn on the power transistor 23. Simultaneously, the second drive circuit 72 generates the sink current. As a result, the voltage Vdr for driving the power transistor 23 rises with two local maximum values and then substantially achieves a predetermined voltage.

Specifically, the voltage Vdr first rises with a large slope B1, based on the charge current for turning on the power transistor 23. Then, when the power transistor 23 is turned on, the change in the charge current caused by turning on the power transistor 23 and the sink current for turning off the power transistor 23 affect the voltage Vdr such that a slope B2 of the voltage Vdr becomes negative, and the voltage Vdr drops. Thereafter, when the power transistor 23 is turned on with the charge current, the change in the charge current is stabilized, and the voltage Vdr rises with a slope B3 smaller than the slope B1. However, thereafter, due to the effect of the sink current, a slope B4 of the voltage Vdr becomes negative and the voltage Vdr decreases. Then, the voltage Vdr substantially achieves the predetermined voltage.

At time t43, the adjustment circuit 81 outputs the low control signal D2 in the no-drive state, and the voltage drive period ends.

At this time, the gate voltage Vg of the PMOS transistor 130 is pulled up so as to gradually reach the power supply voltage Vcc.

At time t44, at which the predetermined time period to has elapsed since the time t40, the timer 92 outputs the high clock signal trd.

At this time, the voltage Vdr is higher than the upper-limit level (specifically, the voltage Vdr_div is higher than the reference voltage VREF3). Accordingly, if the voltage Vdr_div is higher than the reference voltage VREF3 at the rising edge of the clock signal trd two more times, the determination circuit 80 outputs the signal Sdown.

When the SR flip-flop 57 outputs the low signal IN at time t45, the timer 92 outputs the low clock signal trd.

Moreover, the second drive circuit 72 stops supplying the source current to the terminal OUT according to the voltage Vdr_div.

Figure 12:
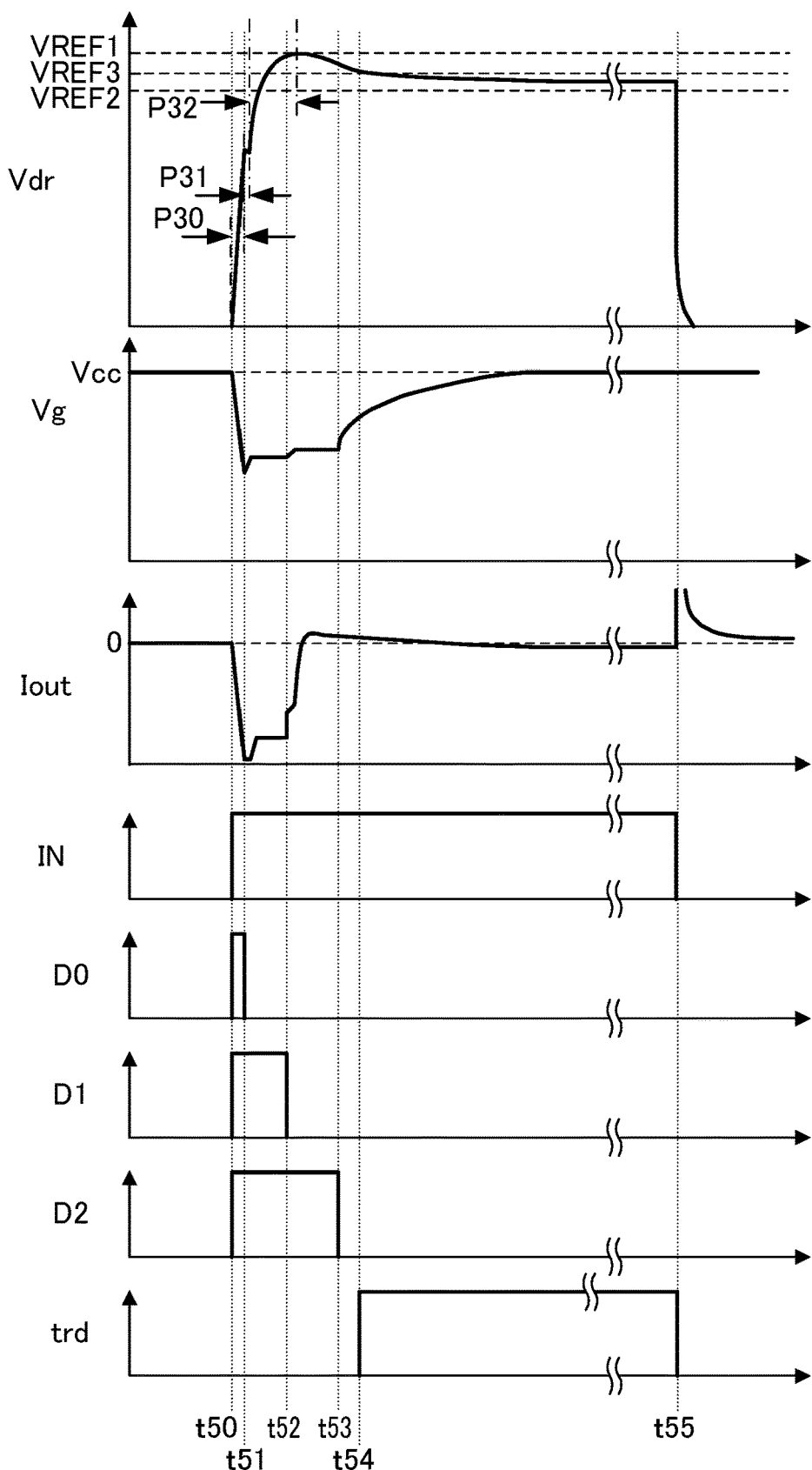
FIG. 12 is a diagram illustrating an example of an operation of a switching control IC 22 when causing a voltage Vdr is to be equal to or lower than an upper-limit level.

FIG. 12 is a diagram illustrating an example of an operation of the switching control IC 22 when causing the voltage Vdr is to be equal to or lower than the upper-limit level. Operations of the circuits from time t50 to time t55 are substantially the same as the operations of the circuits from time t40 to time t45 in FIG. 11. Note that causes of changes in the voltage Vdr in time periods P30 to P32 in FIG. 12 are similar to the causes of the changes in the voltage Vdr in time periods P20 to P22 in FIG. 11.

FIG. 12 is different from FIG. 11 in that the voltage drive period decreases after the output of the signal Sdown by the determination circuit 80, which results in that the voltage Vdr drops below the upper-limit level (i.e., the voltage Vdr_div drops below the reference voltage VREF3) at time t54. Thus, the determination circuit 80 stops the output of the signal Sdown at time t54.

Accordingly, when the voltage Vdr is higher than the upper-limit level, the switching control IC 22 can control the first drive circuit 71 and the second drive circuit 72 such that the voltage Vdr falls within the predetermined range.

The following describes the relationships in FIGS. 9 to 12 referring to FIGS. 3 and 4 again. The switching control IC 22 may perform the operation of FIG. 9 in the (N−2)th and (N−1)th periods in FIGS. 3 and 4, and perform the operation of FIG. 9 also in the Nth period in FIGS. 3 and 4. In this case, the determination circuit 80 outputs the high signal Sup in the Nth period in FIGS. 3 and 4. As a result, the switching control IC 22 performs the operation of FIG. 10 in the (N+1)th period in FIGS. 3 and 4.

Meanwhile, the switching control IC 22 may perform the operation of FIG. 11 in the (N−2)th and (N−1)th periods in FIGS. 3 and 4, and perform the operation of FIG. 11 also in the Nth period in FIGS. 3 and 4. In this case, the determination circuit 80 outputs the high signal Sdown in the Nth period in FIGS. 3 and 4. As a result, the switching control IC 22 performs the operation of FIG. 12 in the (N+1)th period in FIGS. 3 and 4.

<<<Operation Example of Switching Control IC 22 when Signal en is Low>>>

Figure 13:
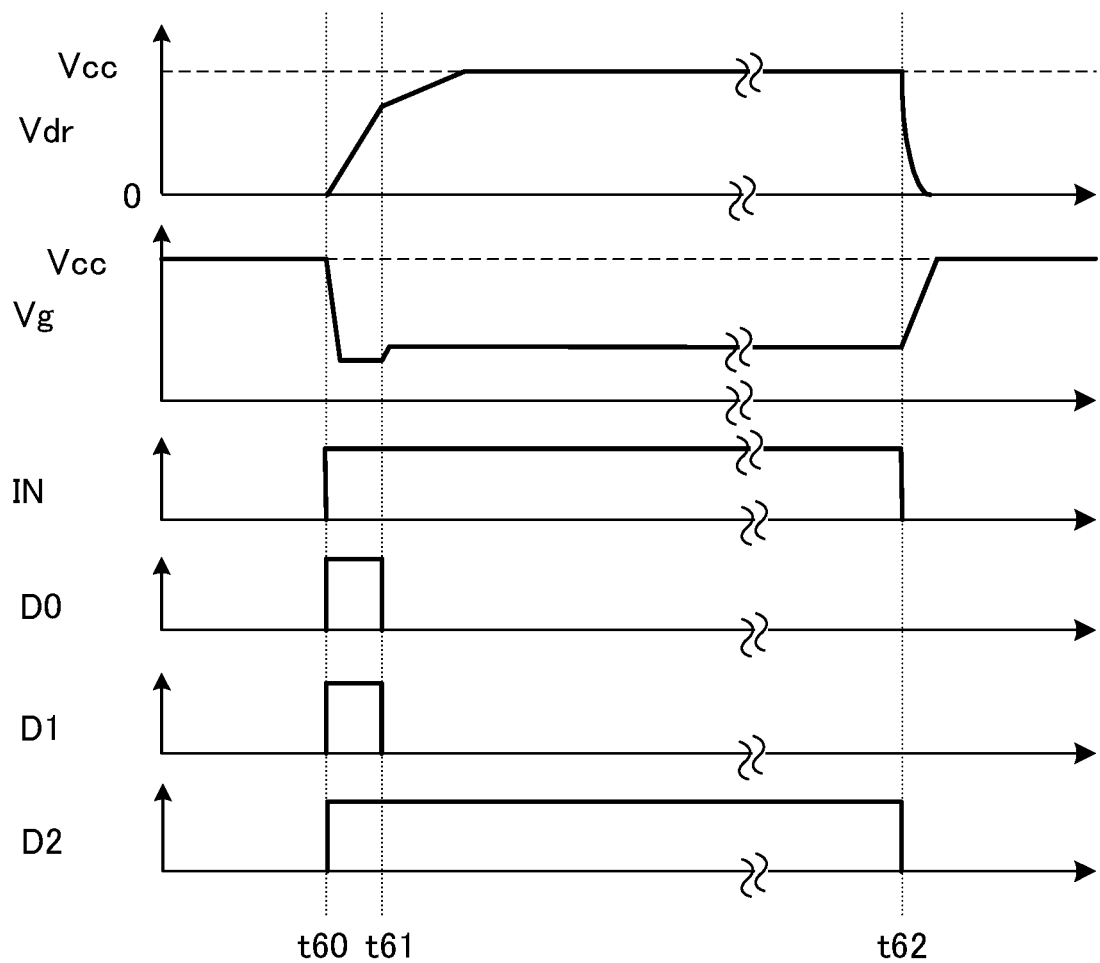
FIG. 13 is a diagram illustrating an example of an operation of a switching control IC 22 when a signal en is low.

The following describes an operation of the switching control IC 22 when the signal en is low. FIG. 13 is a diagram illustrating an example of an operation of the switching control IC 22 when the signal en is low.

When the SR flip-flop 57 outputs the high signal IN at time t60, the adjustment circuit 81 outputs the high control signals D0 to D2. At this time, the adjustment circuit 81 outputs the low control signal D3.

Moreover, since the signal en is low, the second drive circuit 72 stops operating.

At this time, in the state 4, the gate voltage Vg of the PMOS transistor 130 is the minimum, the driving capability of the PMOS transistor 130 is the maximum, and the on-resistance is the minimum. As a result, the voltage Vdr rises with the maximum slope.

The power supply voltage Vcc of the drive voltage is lower than those in such states as described in FIGS. 9 to 12, and the state where the gate voltage Vg is the minimum may continue for a long time. Accordingly, there is no such a transition of the voltage Vdr including two inflection points as described by using the time periods P0 to P2.

Similarly, the power supply voltage Vcc of the drive voltage is lower than those in such states as described in FIGS. 9 to 12, the state where the gate voltage Vg is the minimum continues for a long time, and the second drive circuit 72 may not operate. Accordingly, there is no such a transition of the voltage Vdr drawing a curve protruding upward twice as described by using the time periods P20 to P22.

At time t61, the adjustment circuit 81 outputs the low control signals D0 and D1 in the state 5.

At this time, the gate voltage Vg of the PMOS transistor 130 becomes higher than the voltage in the state 4, the driving capability of the PMOS transistor 130 decreases as compared with that in the state 4, and the on-resistance increases. As a result, the voltage Vdr rises with a slope smaller than that in the state 4. Then, the voltage Vdr becomes flat at the point at which the voltage Vdr reaches the power supply voltage Vcc.

When the SR flip-flop 57 outputs the low signal IN at time t62, the adjustment circuit 81 outputs the low control signal D2.

===Summary===

The AC-DC convertor 10 according to an embodiment of the present disclosure has been described above. The switching control IC 22 uses the first drive circuit 71 to drive the power transistor 23 via the terminal OUT during the voltage drive period, and uses the second drive circuit 72 with the driving capability lower than that of the first drive circuit 71 to drive the power transistor 23 via the terminal OUT during the current drive period. Accordingly, the switching control IC 22 can cause the voltage Vdr to steeply rise, and then gradually reach the target voltage. Accordingly, it is possible to provide an integrated circuit capable of safely driving a power transistor even when a power supply voltage is high.

Moreover, the control circuit 70 compares the voltage Vdr at the terminal OUT upon turning on the power transistor 23 with the reference voltages VREF2 and VREF3, to thereby control the first drive circuit 71 such that the voltage Vdr falls within the predetermined range. This enables the switching control IC to control the voltage Vdr so as to fall within the predetermined range.

Furthermore, the control circuit 70 includes: the determination circuit 80 that determines whether the voltage Vdr is higher or lower than the predetermined range; and the adjustment circuit 81 that controls the voltage drive period in response to the signals Sup and Sdown. This makes it possible to control the voltage drive period, to thereby control the voltage Vdr so as to achieve the target voltage.

Moreover, the determination circuit 80 determines whether the voltage Vdr falls within the predetermined range, and when the voltage Vdr falls within the predetermined range, the adjustment circuit 81 maintains the voltage drive period. This enables the switching control IC 22 to continue the state in which the voltage Vdr falls within the predetermined range.

Furthermore, the second drive circuit 72 drives the power transistor 23 via the terminal OUT during the current drive period. This enables the switching control IC 22 to control such that the voltage Vdr gradually reaches the target voltage after the voltage drive period.

Moreover, the first drive circuit 71 reduces the driving capability in the voltage drive period. This enables the switching control IC 22 to have high driving capability immediately after the rise in the signal IN and then reduce the driving capability, thereby causing the rise of the voltage Vdr to be faster and gradually changing the voltage Vdr to the target voltage.

Furthermore, the first drive circuit 71 controls the PMOS transistor 130 in response to the control signals D0 and the like in the voltage drive period, to change the gate voltage Vg in the voltage drive period so as to increase the on-resistance of the PMOS transistor 130. This enables the switching control IC 22 to reduce the driving capability of the PMOS transistor 130 and cause the rise in the voltage Vdr to be faster and gradually changing the voltage Vdr to the target voltage.

Moreover, the first drive circuit 71 further includes the Zener diode 132, and the voltage output circuit 101 is the voltage divider circuit that includes the resistor coupled to the Zener diode 132 in parallel, the resistor having the resistance value R1$a$ or R1$b$, and that has the voltage divider resistance value that changes in response to the control signals D0 and the like such that the voltage Vg is applied to the gate electrode of the PMOS transistor 130 during the voltage drive period. This makes it possible to generate the voltage Vg based on the voltage Vcc in accordance with the reduction in the current flowing through the Zener diode 132 while the Zener diode 132 protecting the PMOS transistor 130.

Furthermore, the voltage divider circuit includes: the first variable resistor 121 coupled to the Zener diode 132 in parallel, the second variable resistor 123, and the NMOS transistor 122 that is coupled between the first variable resistor 121 and the second variable resistor 123, the NMOS transistor 122 being configured to be turned on in the voltage drive period such that the voltage Vg is applied to the gate electrode of the PMOS transistor 130 during the voltage drive period. Then, the resistance value R1a or R1b of the first variable resistor 121 and the resistance value R2a, R2b or R2c of the second variable resistor 123 change in response to the control signals D0 and the like in the voltage drive period. This enables the switching control IC 22 to change the voltage Vg in a stepwise manner and causes the rise in the voltage Vdr to be faster and gradually changing the voltage Vdr to the target voltage.

Moreover, the voltage output circuit 101 is the voltage divider circuit that applies the voltage Vg generated based on the voltage Vcc to the PMOS transistor 130 in response to the control signals D0 and the like. Here, with the resistance value of the voltage divider circuit being appropriately designed such that the PMOS transistor 130 is not be broken, the switching control IC 22 can change the voltage Vg in a stepwise manner, cause the rise in the voltage Vdr to be faster, and gradually change the voltage Vdr to the target voltage, without the Zener diode 132.

Furthermore, the second drive circuit 72 includes the source circuit 140 that outputs, from the terminal OUT, the source current corresponding to a difference between the voltage Vdr and the voltage level that is higher than the threshold of the power transistor 23 and lower than the withstand voltage of the power transistor 23. This enables the switching control IC 22 to gradually change the voltage Vdr to the target voltage, after the voltage drive period ends and the PMOS transistor 130 stops driving the terminal OUT. Moreover, setting the target voltage to a low level enables the use of a less expensive power transistor.

Moreover, the second drive circuit 72 further includes the sink circuit 141 that increases the sink current that is to be received via the terminal OUT when the voltage Vdr_div exceeds the reference voltage VREF1. This enables the switching control IC 22 to control the voltage Vdr so as to fall within the predetermined range even when the power supply voltage Vcc rises.

Furthermore, the enable circuit 54 determines whether the power supply voltage Vcc_div is higher than the reference voltage VREF1 or VREF2 and outputs the signal en. Then, the first drive circuit 71 changes the operation, according to the control signals D0 and the like that change in response to the signal en, and the second drive circuit 72 stops operating in response to the low signal en. This enables the switching control IC 22 to drive the power transistor 23 with the power supply voltage Vcc, in the case where the power supply voltage Vcc drops and is usable as the voltage Vdr that is to be applied to the power transistor 23.

Moreover, the present disclosure would not be needed if the switching control IC 22 can regulate the power supply voltage Vcc and internally generate a power supply voltage desirable for obtaining the voltage Vdr, since the drive circuit 60 only has to use this desirable power supply voltage. However, in order to generate such a desirable power supply voltage from the power supply voltage Vcc, the desirable power supply voltage (e.g., constant voltage of about 15 V to 20V) is needed to be generated from the power supply voltage Vcc which actually has a large fluctuation amount (e.g., about 10 V to 60 V as an auxiliary winding voltage). Since a voltage regulator for this has a large area, it is impossible to use an element obtained through a standard manufacturing process. Moreover, since a high-capacitance capacitor for stabilization cannot be incorporated in the switching control IC, a terminal for coupling to an external capacitor needs to be prepared separately in addition to the terminal VCC. The present disclosure negates the need for such a voltage regulator, and can achieve cost reduction of the switching control IC 22 and elimination of the unnecessary voltage regulator.

Furthermore, the switching control IC 22 is preferably used in the AC-DC convertor 10.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

The present disclosure is able to provide an integrated circuit capable of driving a power transistor safely even when a power supply voltage is high.

What is claimed is:

1. An integrated circuit for a power supply circuit configured to generate an output voltage at a target level from an alternating current (AC) voltage input thereto, the power supply circuit including
    an inductor to which a rectified voltage corresponding to the AC voltage is applied,
    a power transistor configured to control an inductor current flowing through the inductor,
the integrated circuit comprising:
    a first terminal that receives a power supply voltage for operating the integrated circuit, the power supply voltage being generated according to a variation in the inductor current;
    a second terminal to which a control electrode of the power transistor is coupled;
    a first drive circuit configured to drive the power transistor via the second terminal during a first time period to turn on the power transistor; and
    a second drive circuit configured to drive the power transistor via the second terminal during a second time period to turn on the power transistor, the second time period including at least a part of the first time period, the second drive circuit having driving capability lower than that of the first drive circuit.

2. The integrated circuit according to claim 1, further comprising a control circuit configured to control the first drive circuit such that a voltage at the second terminal is within a predetermined range, based on the voltage at the second terminal upon turning on the power transistor.

3. The integrated circuit according to claim 2, wherein the control circuit includes:
    a first determination circuit configured to determine whether the voltage at the second terminal is higher or lower than the predetermined range; and
    an adjustment circuit configured to
        increase the first time period, when the voltage at the second terminal is lower than the predetermined range, and
        reduce the first time period, when the voltage at the second terminal is higher than the predetermined range, based on a result of determination of the first determination circuit.

4. The integrated circuit according to claim 3, wherein
the first determination circuit further determines whether the voltage at the second terminal is within the predetermined range, and
the adjustment circuit maintains the first time period, when the voltage at the second terminal is within the predetermined range.

5. The integrated circuit according to claim 1, wherein the second drive circuit drives the power transistor via the second terminal during the second time period, the second time period including the first time period and being longer than the first time period.

6. The integrated circuit according to claim 1, wherein the first time period includes
a first sub-period, and
a second sub-period subsequent to the first sub-period, the driving capability being higher in the first sub-period than in the second sub-period.

7. The integrated circuit according to claim 6, wherein the first drive circuit includes
a first transistor coupled between the first terminal and the second terminal, and
a voltage output circuit configured to receive a control signal, and to apply, to a control electrode of the first transistor, a control voltage for increasing an on-resistance of the first transistor in the first time period, in response to the control signal upon turning on the power transistor.

8. The integrated circuit according to claim 7, wherein
the first drive circuit further includes a clamp element coupled between the first terminal and the control electrode of the first transistor, and
the voltage output circuit is a voltage divider circuit that includes a resistor coupled to the clamp element in parallel, the voltage divider circuit having a voltage divider resistance value that changes in response to the control signal.

9. The integrated circuit according to claim 8, wherein
the resistor coupled to the clamp element in parallel is a first variable resistor, and
the voltage divider circuit further includes
a second variable resistor, and
a second transistor coupled between the first variable resistor and the second variable resistor, the second transistor being configured to be on during the first time period, and
a resistance value of the first variable resistor and a resistance value of the second variable resistor change in the first time period in response to the control signal.

10. The integrated circuit according to claim 7, wherein the voltage output circuit is a voltage divider circuit configured to divide the power supply voltage, to thereby apply a divided voltage to the control electrode of the first transistor in response to the control signal.

11. The integrated circuit according to claim 1, wherein the second drive circuit includes a source circuit configured to output, from the second terminal, a source current corresponding to a difference between a first level and a voltage at the second terminal, and
the first level is higher than a threshold of the power transistor and lower than a withstand voltage of the power transistor.

12. The integrated circuit according to claim 11, wherein
the second drive circuit receives a sink current from the second terminal, and
the second drive circuit further includes a sink circuit configured to increase the sink current when the voltage at the second terminal exceeds a second level, the second level being higher than the first level and lower than the withstand voltage of the power transistor.

13. The integrated circuit according to claim 1, further comprising a second determination circuit configured to determine whether the power supply voltage is higher than a predetermined level, wherein
the first drive circuit
drives the power transistor during the first time period, when the power supply voltage is higher than the predetermined level, and
drives the power transistor for a third time period corresponding to the target level, when the power supply voltage is lower than the predetermined level; and
the second drive circuit
drives the power transistor during the second time period, when the power supply voltage is higher than the predetermined level, and
stops operating, when the power supply voltage is lower than the predetermined level.

14. A power supply circuit configured to generate a direct-current (DC) voltage from an alternating current (AC) voltage inputted thereto, the power supply circuit comprising:
an inductor to which a rectified voltage corresponding to the AC voltage is applied;
a power transistor configured to control an inductor current flowing through the inductor; and
an integrated circuit configured to drive the power transistor, the integrated circuit including
a first terminal that receives a power supply voltage for operating the integrated circuit, the power supply voltage being generated according to a variation in the inductor current,
a second terminal to which a control electrode of the power transistor is coupled,
a first drive circuit configured to drive the power transistor via the second terminal during a first time period to turn on the power transistor, and
a second drive circuit configured to drive the power transistor via the second terminal during a second time period to turn on the power transistor, the second time period including at least apart of the first time period, the second drive circuit having driving capability lower than that of the first drive circuit.

* * * * *